(12) United States Patent
Takeuchi et al.

(10) Patent No.: US 8,044,623 B2
(45) Date of Patent: Oct. 25, 2011

(54) DRIVE CONTROL CIRCUIT FOR ELECTRIC MOTOR

(75) Inventors: Kesatoshi Takeuchi, Shiojiri (JP);
Isamu Sejimo, Matsumoto (JP);
Takafumi Suzuki, Nagoya (JP)

(73) Assignee: Seiko Epson Corporation (JP)

( * ) Notice: Subject to any disclaimer, the term of this patent is extended or adjusted under 35 U.S.C. 154(b) by 472 days.

(21) Appl. No.: 12/164,376

(22) Filed: Jun. 30, 2008

(65) Prior Publication Data

US 2009/0009118 A1 Jan. 8, 2009

(30) Foreign Application Priority Data

Jul. 3, 2007 (JP) ................................ 2007-175469
Dec. 28, 2007 (JP) ................................ 2007-340803
May 14, 2008 (JP) ................................ 2008-127574

(51) Int. Cl.
*H02P 6/08* (2006.01)
*H02K 21/22* (2006.01)
(52) U.S. Cl. .......... 318/400.41; 318/400.29; 318/400.13
(58) Field of Classification Search ............. 318/400.32, 318/400.37, 400.38, 400.41, 479, 504, 700, 318/720–724, 400.13, 400.29
See application file for complete search history.

(56) References Cited

U.S. PATENT DOCUMENTS

| | | | |
|---|---|---|---|
| 3,743,902 A * | 7/1973 | Perkins et al. ........... | 318/400.06 |
| 4,494,052 A * | 1/1985 | Kelleher et al. .......... | 318/400.11 |
| 5,089,955 A | 2/1992 | Morinaga et al. | |
| 5,408,153 A * | 4/1995 | Imai et al. ................... | 310/68 B |
| 5,847,524 A * | 12/1998 | Erdman et al. ............ | 318/400.14 |
| 5,952,798 A * | 9/1999 | Jones et al. ................... | 318/268 |
| 6,396,225 B1 * | 5/2002 | Wakui et al. ............. | 318/400.01 |
| 6,400,107 B1 | 6/2002 | Nakatani et al. | |
| 7,259,531 B1 * | 8/2007 | Liu ........................... | 318/400.38 |
| 2002/0180545 A1 | 12/2002 | Bowling | |
| 2003/0034755 A1 | 2/2003 | Krefta et al. | |
| 2004/0012354 A1 | 1/2004 | Krefta et al. | |
| 2006/0071621 A1 | 4/2006 | Sugiura et al. | |

FOREIGN PATENT DOCUMENTS

| | | |
|---|---|---|
| DE | 199 38 678 | 8/1999 |
| DE | 100 37 936 | 8/2000 |
| JP | 2000-295885 | 10/2000 |
| WO | WO 2005/112230 | 11/2005 |

* cited by examiner

*Primary Examiner* — Bentsu Ro
(74) *Attorney, Agent, or Firm* — Harness, Dickey & Pierce, P.L.C.

(57) ABSTRACT

The drive control circuit for an electric motor is provided. The drive control circuit includes: an original drive signal generator that generates an original drive signal; an excitation interval setter that is able, for each half cycle of respective length π in each 2π excitation cycle of the original drive signal, to arbitrarily set excitation intervals during which to excite coils of the electric motor to any one of a plurality of intervals which include at least either one of a symmetrical interval centered on a center of each half-cycle and an unsymmetrical interval; and a drive signal shaping circuit that generates a drive signal for driving the electric motor, by validating the original drive signal during the excitation intervals and invalidating the original drive signal during non-excitation intervals other than the excitation interval.

19 Claims, 40 Drawing Sheets

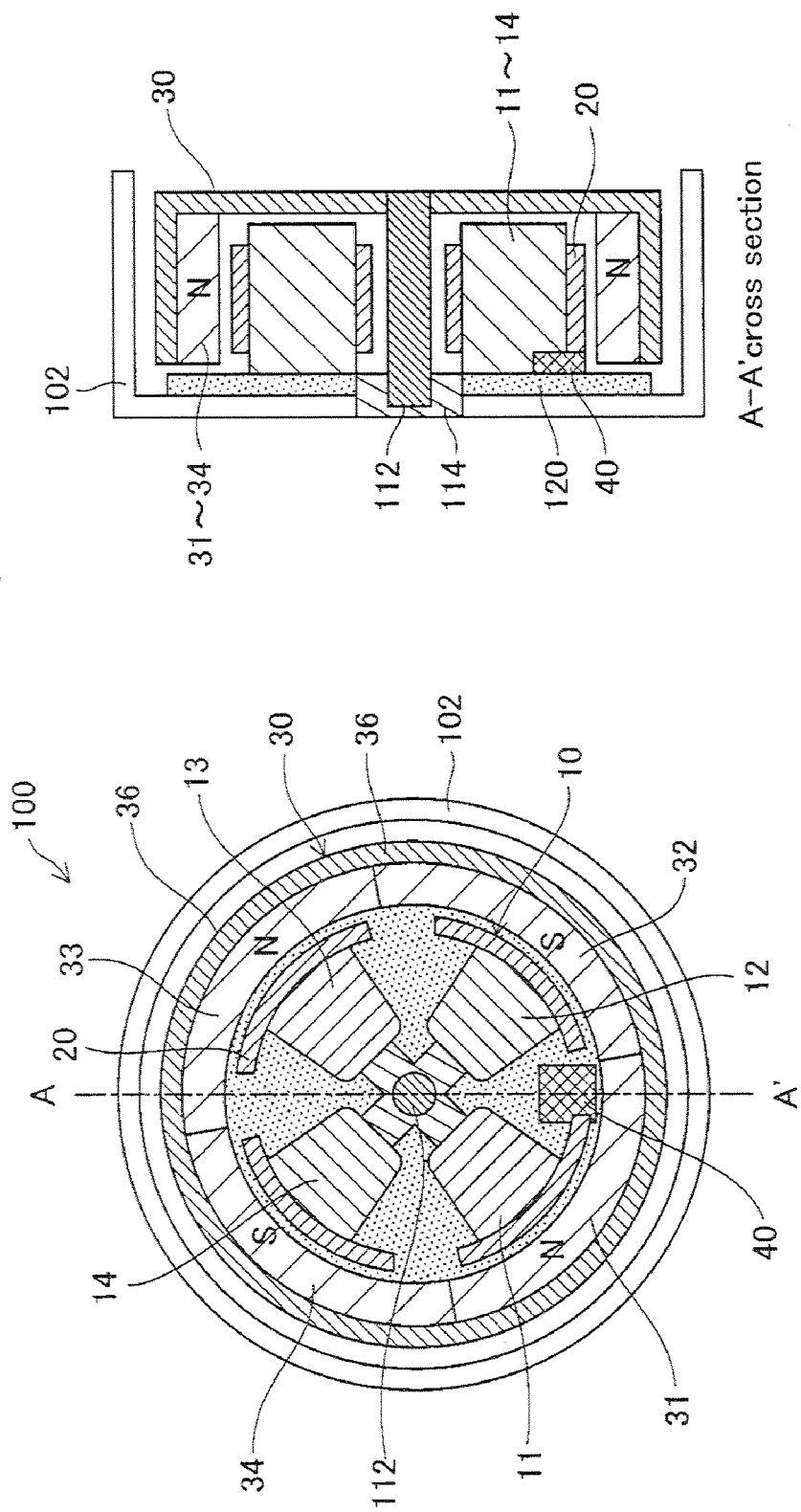

Stop/start (phase = α)

Phase = π/2

Phase = π − α

Phase = π + α

Stop/start (phase = π + α)

$Y = a \cdot X + b$
or
$Y = a(X + b)$

Operation of first bridge circuit 250a

Operation of second bridge circuit 250b 2-pole parallel winding 2-pole series winding 4-pole parallel winding 4-pole series winding

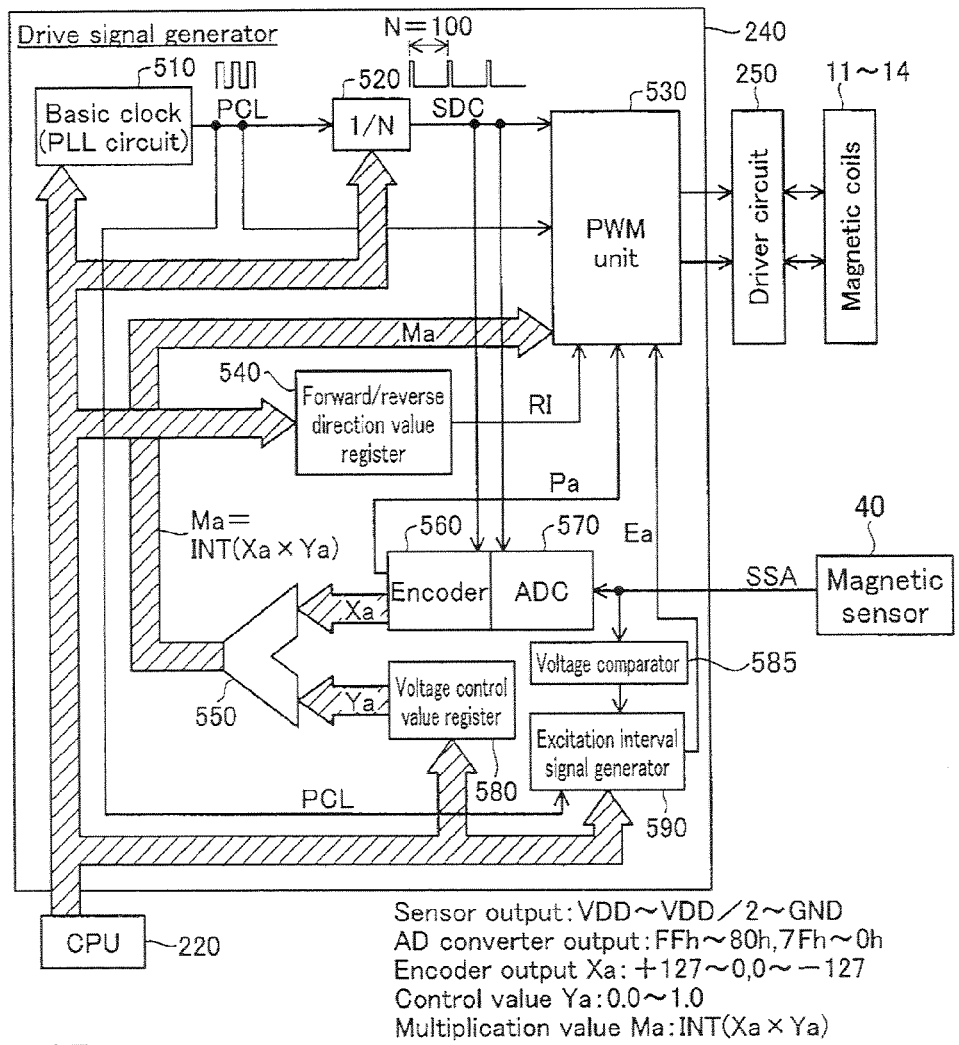

Fig.12A
SSA
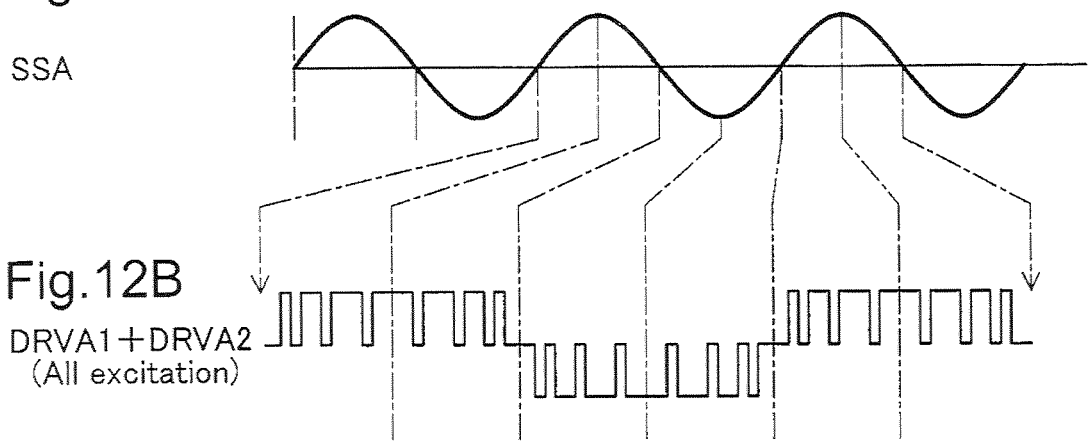
Fig.12B
DRVA1+DRVA2
(All excitation)
Fig.12C
DRVA1+DRVA2
(Excitation interval setting)
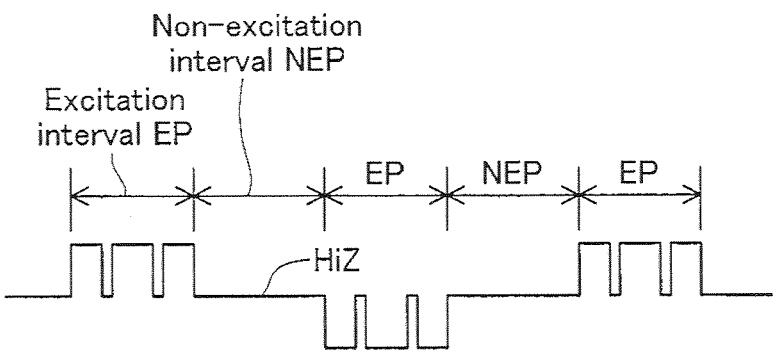

Position when non-excited
(phase = $\alpha \pm n\pi$)

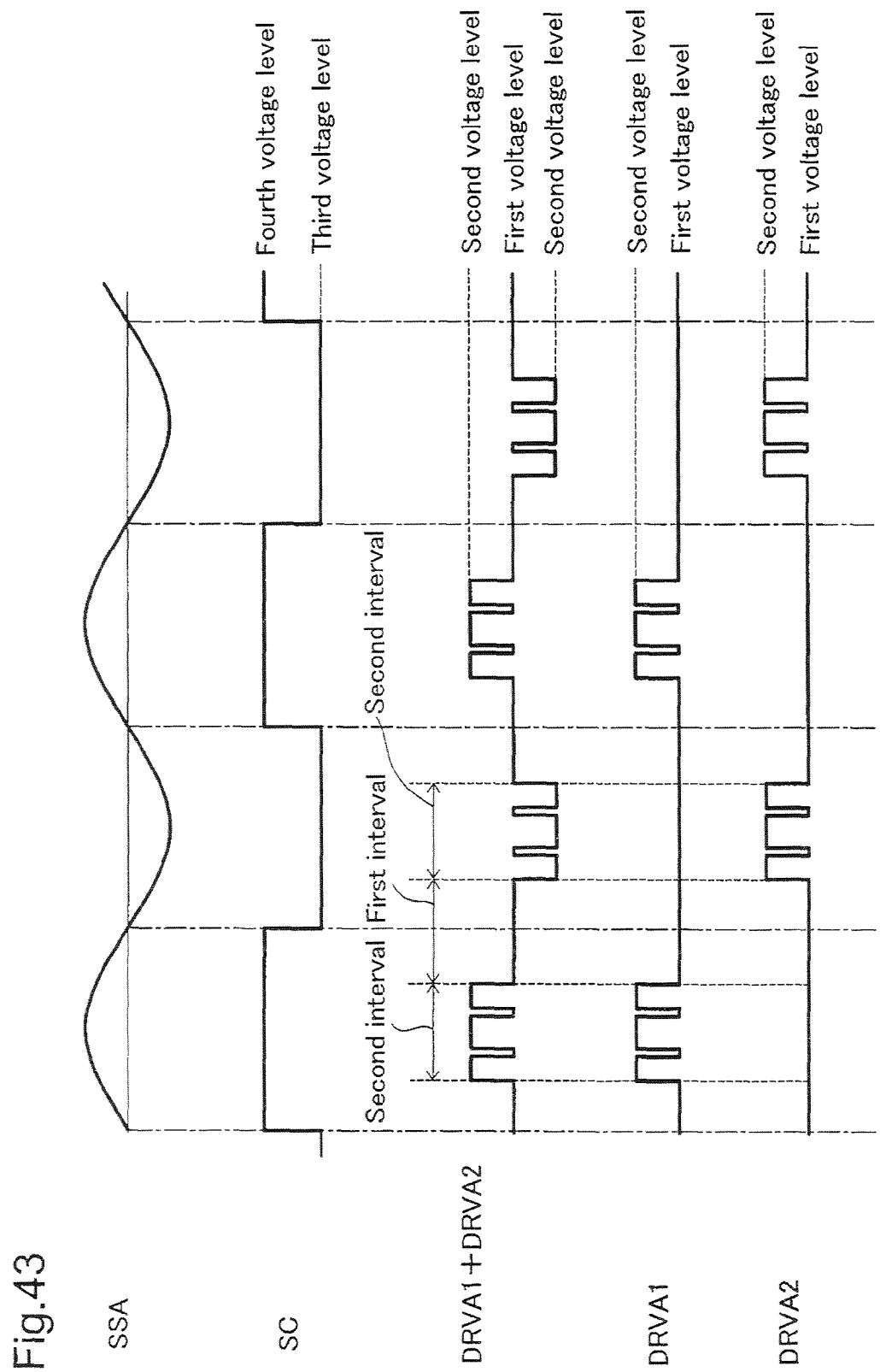

DRIVE CONTROL CIRCUIT FOR ELECTRIC MOTOR

CROSS-REFERENCE TO RELATED APPLICATIONS

The present application claims the priority based on Japanese Patent Applications No. 2007-175469 filed on Jul. 3, 2007; No. 2007-340803 filed on Dec. 28, 2007; and No. 2008-127574 filed on May 14, 2008, the disclosures of which are hereby incorporated by reference in their entireties.

BACKGROUND OF THE INVENTION

1. Field of the Invention

The present invention relates to control of excitation interval of the coils of an electric motor.

2. Description of the Related Art

In a electric motor disclosed in WO2005/112230 A1, a drive signal of the electric motor is masked to reduce power consumption.

With this technology, the excitation interval of the drive signal is specified using an analog circuit which employs resistance. A resultant problem is that in the event that the resistance value changes owing to temperature changes for example, there is an associated change of excitation interval as well. Also, there has been a desire to enhance electric power saving of the electric motor.

SUMMARY

An object of the present invention is to provide technology by which the excitation interval of the drive signal of an electric motor can be formed at will using a digital circuit. Another object of the invention is to provide a power saving motor.

According to an aspect of the present invention, a semiconductor device is provided. The semiconductor device comprises: a drive control circuit that generates a drive signal for driving an electric motor having a permanent magnet and a coil, wherein the drive control circuit generates the drive signal based on a positional signal which indicates relative position of a first drive member and a second drive member of the electric motor, a signal level of the drive signal becomes a first voltage level in a first interval, a signal level of the drive signal becomes a second voltage level which is different from the first voltage level in a second interval, and the coil of the electric motor is not provided with a current in the first interval.

According to this configuration, since the coil of the electric motor is not provided with a current in the first interval, it is possible to enhance electric power saving of the electric motor.

According to another aspect of the present invention, a drive control circuit for an electric motor is provided. The drive control circuit comprises: an original drive signal generator that generates an original drive signal; an excitation interval setter that is able, for each half cycle of respective length $\pi$ in each $2\pi$ excitation cycle of the original drive signal, to arbitrarily set excitation intervals during which to excite coils of the electric motor to any one of a plurality of intervals which include at least either one of a symmetrical interval centered on a center of each half-cycle and an unsymmetrical interval; and a drive signal shaping circuit that generates a drive signal for driving the electric motor, by validating the original drive signal during the excitation intervals and invalidating the original drive signal during non-excitation intervals other than the excitation interval.

According to this configuration, the excitation interval of the drive signal of the electric motor may be formed at will using a digital circuit. By establishing the excitation interval in this way, it is possible to accomplish angle advance control and angle delay control of the electric motor as well.

The present invention may be reduced to practice in various forms, for example, as a method and a device for drive control of an electric motor; a drive control semiconductor device; a drive control system; a computer program for accomplishing the functions of such a method or device; a recording medium having such a computer program recorded thereon; an electric motor furnished with a drive control circuit; a projector, mobile device, robot, and movable body equipped with the electric motor; and so on.

BRIEF DESCRIPTION OF THE DRAWINGS

FIGS. 1A and 1B are sectional views depicting configuration of the motor unit of a single phase brushless motor as a first embodiment of the present invention.

FIGS. 11A to 11E are illustrations depicting internal configuration and operation of a drive signal generating unit.

FIGS. 12A to 12C are illustrations depicting correspondence relationships of sensor output waveform and waveform of drive signals generated by the PWM unit.

FIG. 43 is a timing chart depicting wave forms of various signals with PWM control.

DESCRIPTION OF THE PREFERRED EMBODIMENT

Figure 2A:
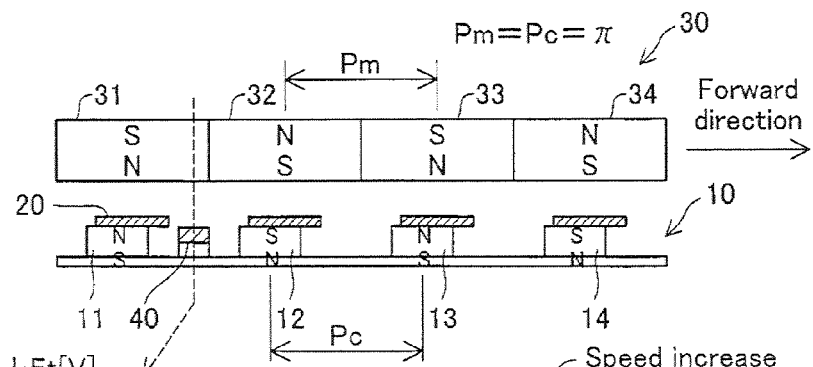
FIGS. 2A to 2C are illustrations depicting positional relationship of a magnet array and a coil array, and the relationship of magnetic sensor output to back electromotive force waveform.

Next, aspects of the present invention will be described in the following order on the basis of embodiments:
A. Embodiment 1:
  A1. Overview of Motor Configuration and Operation:
  A2. Configuration of Drive Control Circuit:
B. Embodiment 2:
C. Embodiment 3:
D. Embodiment 4:
E. Embodiment 5:
F. Embodiment 6:
G. Modifications:
H. Other Embodiments:

A. Embodiment 1

A1. Overview of Motor Configuration and Operation:

FIGS. 1A and 1B are sectional views depicting the configuration of the motor unit of a single-phase brushless motor in Embodiment 1. This motor unit 100 has a stator portion 10 and a rotor portion 30, each of generally cylindrical tube shape. The stator portion 10 has four coils 11-14 arranged in a generally cross-shaped pattern, and a magnetic sensor 40 positioned at a center location between two of the coils 11, 12. The magnetic sensor 40 is used to detect the position of the rotor portion 30 (i.e. the phase of the motor). Each coil 11-14 is provided with a magnetic yoke 20 formed of a magnetic material. The coils 11-14 and the magnetic sensor 40 are affixed on a circuit board 120 (FIG. 1B). The circuit board 120 is affixed to a casing 102. The cover of the casing 102 is omitted in the drawing.

The rotor portion 30 has four permanent magnets 31-34; the center axis of the rotor portion 30 constitutes a rotating shaft 112. This rotating shaft 112 is supported by a shaft bearing portion 114 (FIG. 1B). The direction of magnetization of the magnets extends in a direction radially outward from the rotating shaft 112. A magnetic yoke 36 is disposed to the outside of the magnets 31-34. This magnetic yoke 36 may be omitted.

Figure 2B:
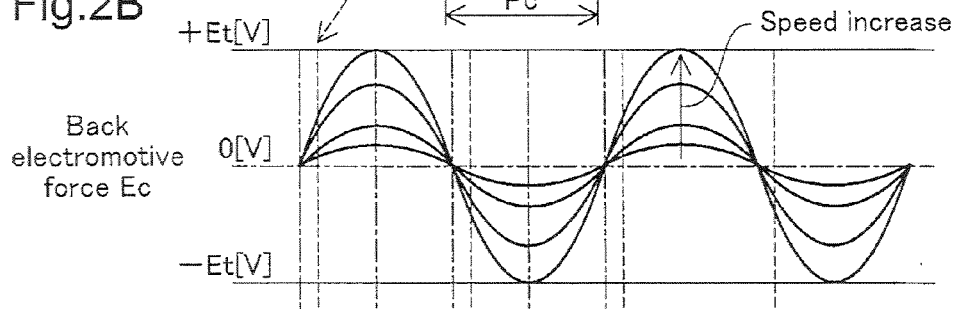
Figure 2C:
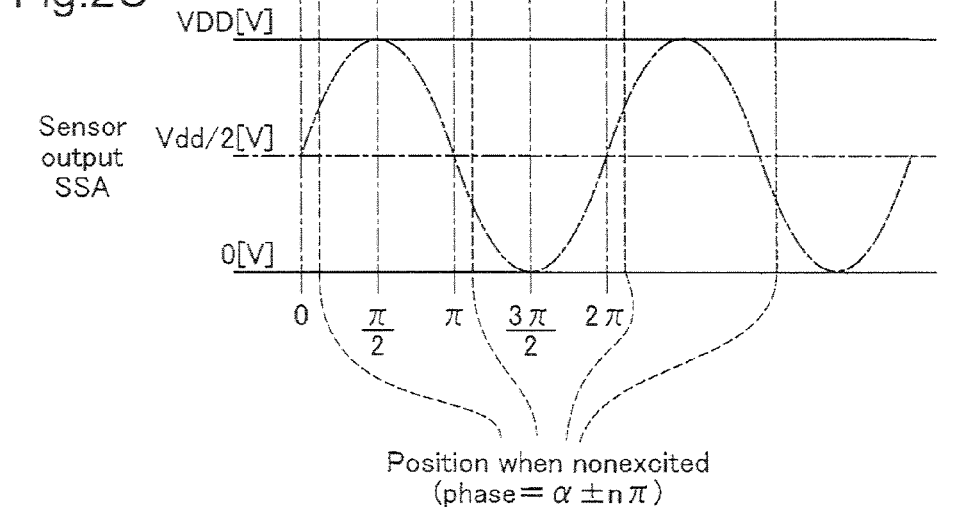

FIG. 2A illustrates the positional relationship of a magnet array and a coil array. FIGS. 2B and 2C show the relationship of magnetic sensor output to back electromotive force waveform. As shown in FIG. 2A, the four magnets 31-34 are arranged at constant magnetic pole pitch Pm, with adjacent magnets being magnetized in opposite directions. The coils 11-14 are arranged at constant pitch Pc, with adjacent coils being excited in opposite directions. In this example, the magnetic pole pitch Pm is equal to the coil pitch Pc, and is equivalent to $\pi$ in terms of electrical angle. An electrical angle of $2\pi$ is associated with the mechanical angle or distance of displacement when the phase of the drive signal changes by $2\pi$. In the present embodiment, when the phase of the drive signal changes by $2\pi$, the rotor portion 30 undergoes displacement by the equivalent of twice the magnetic pole pitch Pm.

Of the four coils 11-14, the first and third coils 11, 13 are driven by drive signals of identical phase, while the second and fourth coils 12, 14 are driven by drive signals whose phase is shifted by 180 degrees ($=\pi$) from the drive signals of the first and third coils 11, 13. In ordinary two-phase driving, the phases of the drive signals of the two phases (Phase A and Phase B) would be shifted by 90 degrees ($=\pi/2$); in no instance would they be shifted by 180 degrees ($=\pi$). Also, in most motor drive methods, two drive signals phase-shifted by 180 degrees ($=\pi$) would be viewed as having identical phase. Consequently, the drive method of the motor in the present embodiment can be though of as single-phase driving.

FIG. 2A shows the positional relationship of the magnets 31-34 and the coils 11-14, with the motor at a stop. In the motor of this embodiment, the magnetic yoke 20 provided to each of the coils 11-14 is offset slightly towards the direction of normal rotation of the rotor portion 30, with respect to the center of the coil. Consequently, when the motor stops, the magnetic yoke of each coil will be attracted by the magnets 31-34, bringing the rotor portion 30 to a halt at a position with the magnetic yokes 20 facing the centers of the magnets 31-34. As a result, the motor will come to a halt at a position with the centers of the coils 11-14 offsetted with respect to the centers of the magnets 31-34. The magnetic sensor 40 is also situated at a position offsetted slightly from the boundary between adjacent magnets. The phase at this stop location is denoted as α. While the α phase is not zero, it may be a value close to zero (e.g. about 5 to 10 degrees).

FIG. 2B shows an example of waveform of back electromotive force generated by the coils; FIG. 2C shows an example of output waveform by the magnetic sensor 40. The magnetic sensor 40 is able to generate a sensor output SSA substantially similar in shape to the back electromotive force of the coils during motor operation. However, the output SSA of the magnetic sensor 40 has a non-zero value even when the motor is stopped (except in the case where the phase is an integral multiple of π). The back electromotive force of the coils tends to increase together with motor speed, but the shape of the waveform (sine wave) remains substantially similar. A Hall IC that utilizes the Hall effect may be employed as the magnetic sensor 40. In this example, the sensor output SSA and the back electromotive force Ec are both sine wave waveforms, or waveforms approximating a sine wave. As will be discussed later, the drive control circuitry of this motor utilizes the sensor output SSA to apply to the coils 11-14 voltage of waveform substantially similar in shape to the back electromotive force Ec.

In general, an electric motor functions as an energy conversion device that converts between mechanical energy and electrical energy. The back electromagnetic force of the coils represents mechanical energy of the motor that has been converted to electrical energy. Consequently, where electrical energy applied to the coils is converted to mechanical energy (that is, where the motor is driven), it is possible to drive the motor with maximum efficiency by applying voltage of similar waveform to the back electromagnetic force. As will be discussed below, "similar waveform to the back electromagnetic force" means voltage that generates current flowing in the opposite direction from the back electromagnetic force.

Figure 3:
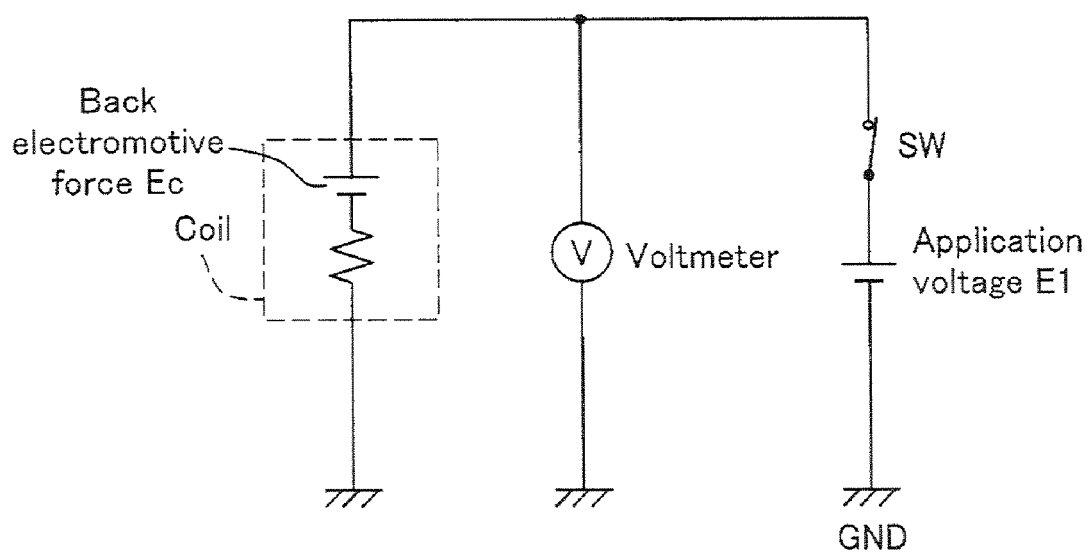
FIG. 3 is a model diagram illustrating the relationship of coil applied voltage and electromotive force.

FIG. 3 is a model diagram illustrating the relationship of applied voltage to the coil and electromotive force. Here, the coil is simulated in terms of back electromotive force Ec and resistance. In this circuit, a voltmeter V is parallel-connected to the application voltage E1 and the coil. When voltage E1 is applied to the motor to drive the motor, back electromotive force Ec is generated with a direction of current flow in opposition to that of the application voltage E1. When a switch SW is opened while the motor is rotating, the back electromotive force Ec can be measured with the voltmeter V. The polarity of the back electromotive force Ec measured with the switch SW open will be the same as the polarity of the application voltage E1 measured with the switch SW closed. The phrase application of voltage of substantially similar waveform to the back electromagnetic force herein refers to application of voltage having the same polarity as, and having waveform of substantially similar shape to, the back electromotive force Ec measured by the voltmeter V.

As noted previously, when driving a motor, it is possible to drive the motor with maximum efficiency through application of voltage of waveform similar to that of the back electromagnetic force. It can be appreciated that energy conversion efficiency will be relatively low in proximity to the midpoint (in proximity to 0 voltage) of the sine wave waveform of back electromotive force, while conversely energy conversion efficiency will be relatively high in proximity to the peak of the back electromotive force waveform. Where a motor is driven by applying voltage of waveform similar to that of the back electromotive force, relatively high voltage can be applied during periods of high energy conversion efficiency, thereby improving efficiency of the motor. On the other hand, if the motor is driven with a simple rectangular waveform for example, considerable voltage will be applied in proximity to the position where back electromotive force is substantially 0 (midpoint) so motor efficiency will drop. Also, when voltage is applied during such periods of low energy conversion efficiency, due to eddy current vibration will be produced in directions other than the direction of rotation, thereby creating a noise problem.

As will be understood from the preceding discussion, the advantages of driving a motor by applying voltage of similar waveform to the back electromotive force are that motor efficiency will be improved, and vibration and noise will be reduced.

Figure 4A:
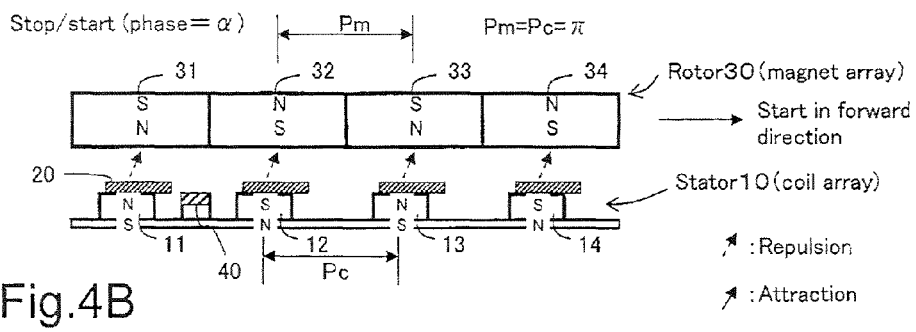
FIGS. 4A to 4E are illustrations depicting forward operation of the motor.

FIGS. 4A to 4E illustrate normal rotation of the motor unit 100. FIG. 4A is the same as FIG. 2A, and depicts the positional relationships of the magnets 31-34 and the coils 11-14 at a stop. In the state depicted in FIG. 4A, excitation of the coils 11-14 produces forces of repulsion between the coils 11-14 and the magnets 31-34, in the direction indicated by the broken arrows. As a result, the rotor portion 30 begins to move in the direction of normal rotation (rightward in the drawing).

Figure 4B:
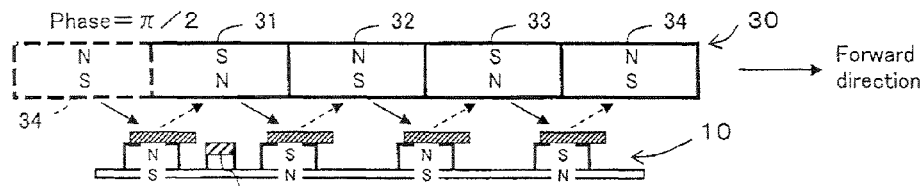
Figure 4C:
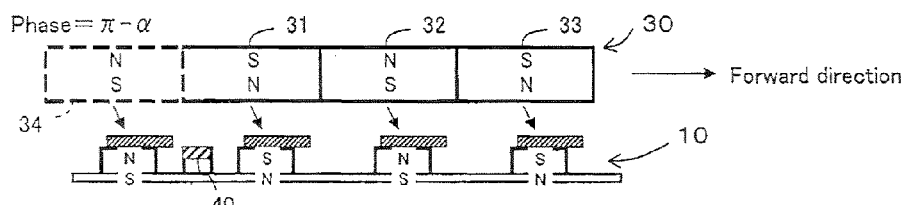
Figure 4D:
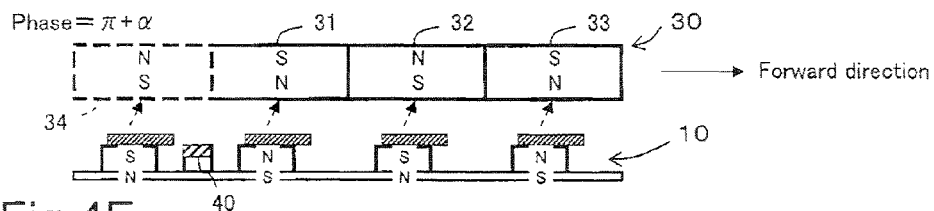
Figure 4E:
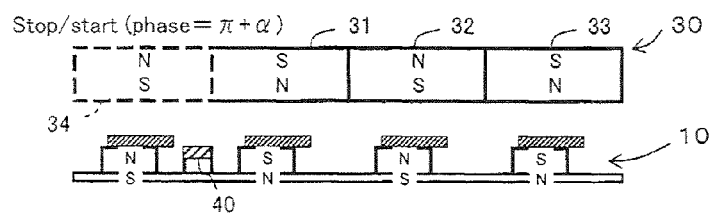

FIG. 4B depicts a state in which the phase has advanced to π/2. In this state, both forces of attraction (the solid arrows) and forces of repulsion (the broken arrows) are generated, causing strong driving force. FIG. 4C depicts a state in which the phase has advanced to (π−α). The coil excitation direction reverses coincident with the timing of the phase going to π, resulting in the state shown in FIG. 4D. If the motor stops in proximity to the state shown in FIG. 4D, the rotor portion 30 will come to stop at a position like that state shown in FIG. 4E, with the magnetic yokes 20 attracted towards the magnets 31-34. This position is the (π+α) phase position. Thus, it will be understood that the motor of the present embodiment will come to a stop at a phase position of α±nπ where n is an integer.

Figure 5A:
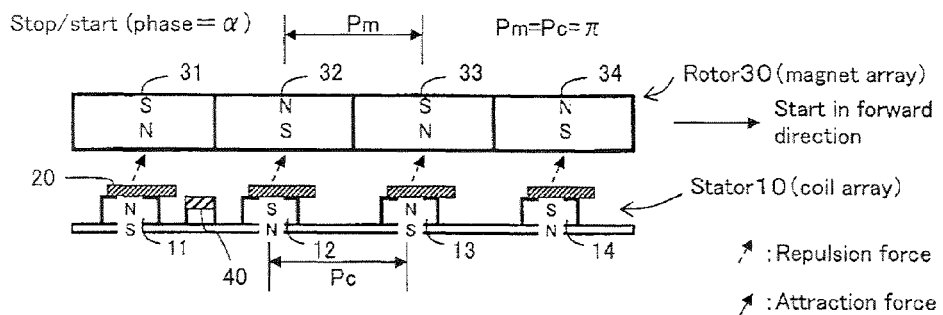
FIGS. 5A to 5E are illustrations depicting reverse operation of the motor.

FIGS. 5A to 5E illustrate reverse rotation of the motor unit 100. FIG. 5A is the same as FIG. 4A, and depicts the motor at a stop. When the coils 11-14 are excited in the opposite direction from FIG. 4A for the purpose of reverse rotation from a stop, forces of attraction (not shown) act between the magnets 31-34 and the coils 11-14. These forces of attraction urge the rotor portion 30 to move in the direction of reverse rotation. However, since the forces of attraction are fairly weak, in some instances they will be overcome by the forces of attraction between the magnets 31-34 and the magnetic yokes 20, and reverse rotation of the rotor portion 30 will not be possible.

Figure 5B:
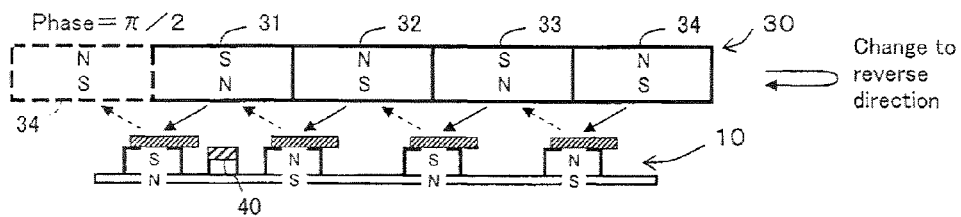
Figure 5C:
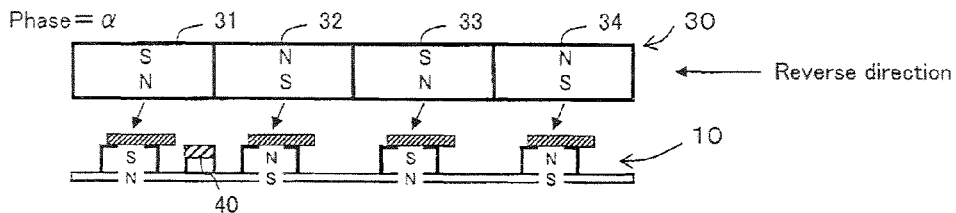
Figure 5D:
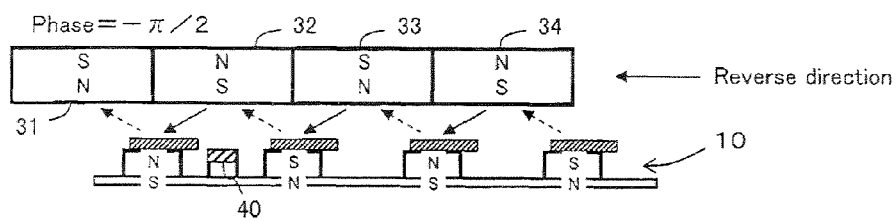
Figure 5E:
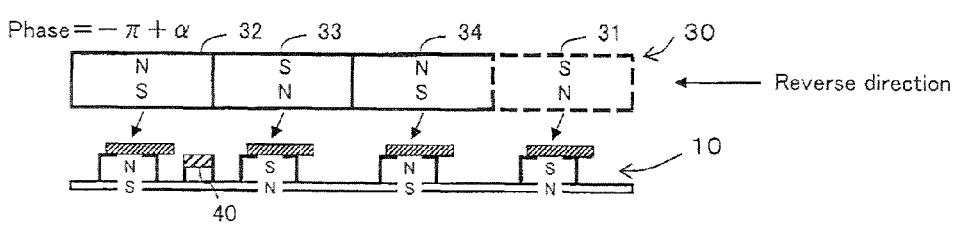

Accordingly, in the present embodiment, even where the motor is to be operated in reverse, at startup the rotor portion 30 will be initially operated in the normal rotation direction as shown in FIG. 5A. Then, once the rotor portion 30 has rotated by a prescribed amount (e.g. when the phase has advanced by about π/2), the drive signal will reversed and reverse operation initiated as shown in FIG. 5B. Once the rotor portion 30 begins to rotate in reverse in this way, the rotor portion 30 will be able to pass the initial stop position (phase=α) due to inertia (FIG. 5C). Subsequently, the coil excitation direction reverses coincident with the timing of the phase going to 0. FIG. 5D depicts the −π/2 phase state, and FIG. 5E depicts the −π+α phase state. If the motor is stopped in proximity to the state of FIG. 5E, the rotor portion 30 will a come to a stop at a position of phase=−π+α with the magnetic yokes 20 attracted by the magnets 31-34.

Figure 6:
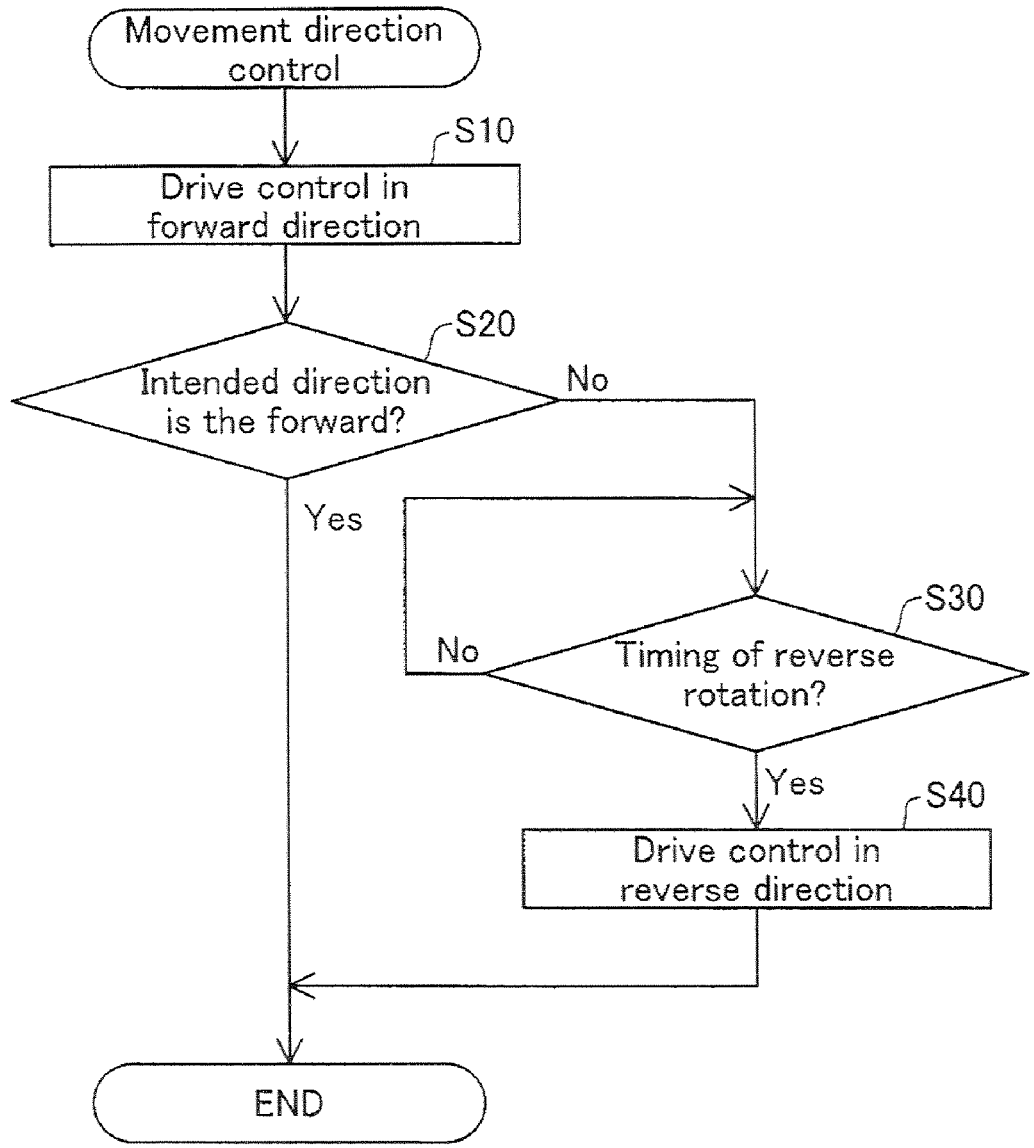
FIG. 6 is a flowchart illustrating a control process of the direction of movement of the motor.

FIG. 6 is a flowchart illustrating the control process of the direction of movement of the motor. This process is executed by a drive control circuit, to be discussed later. First, in Step S10, drive control in the forward direction is initiated. In Step S20, it is determined whether the intended direction of movement is the forward direction. The direction of movement will have been input to the drive control circuit by a human operator prior to Step S10. In the event that the intended direction of movement is the forward direction, drive control in the forward direction will continue on as-is. If on the other hand the intended direction of movement is the reverse direction, in Step S30, the circuit will wait for the prescribed timing of reverse rotation. Once the prescribed timing of reverse rotation is reached, in Step S40, drive control in the reverse direction is initiated.

In this way, with the motor of the present embodiment, the motor will come to a stop at a phase position of α±nπ where α is a prescribed value other than zero or nπ, and n is an integer, and thus deadlock points will be avoided. Accordingly, startup will always be possible without the need for a startup coil. Moreover, with the motor of the embodiment, it is possible to accomplish reverse operation by initiating the motor movement with normal rotation for a prescribed small duration from a stop and subsequently changing to reverse rotation.

A2. Configuration of Drive Control Circuit

Figure 7A:
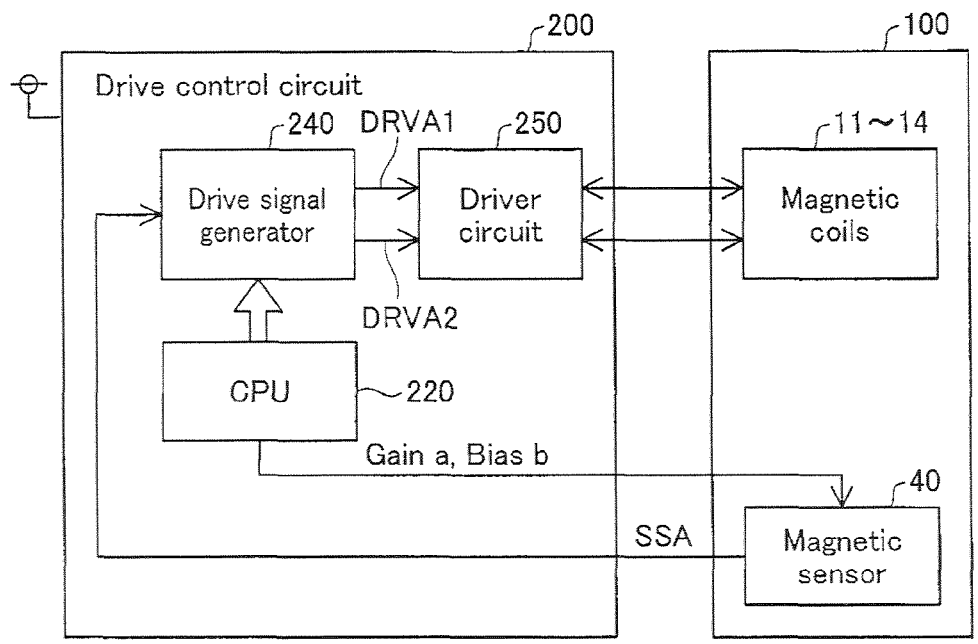
FIG. 7A is a block diagram depicting configuration of a drive control circuit of the brushless motor of the embodiment.

FIG. 7A is a block diagram depicting a configuration of a drive control circuit of the brushless motor of the present embodiment. The drive control circuit 200 has a CPU 220, a drive signal generator 240, and a driver circuit 250. The drive signal generator 240 generates a single-phase drive signal DRVA1, DRVA2 on the basis of the output signal SSA of the magnetic sensor 40 in the motor unit 100. The driver circuit 250 drives the magnetic coils 11-14 in the motor unit 100, in accordance with the single-phase drive signal DRVA1, DRVA2.

Figure 7B:
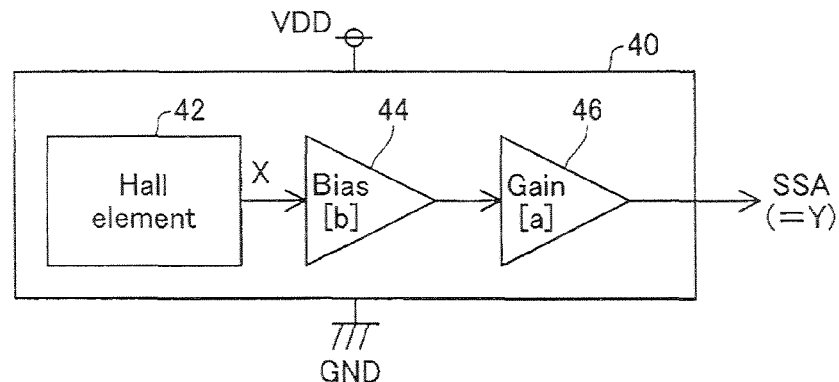
FIG. 7B shows an exemplary internal configuration of the magnetic sensor.

FIG. 7B shows an exemplary internal configuration of the magnetic sensor 40. The magnetic sensor 40 has a Hall element 42, a bias adjuster 44, and a gain adjuster 46. The Hall element 42 measures magnetic flux density X. The bias adjuster 44 adds a bias value b to the output X of the Hall element 42; the gain adjuster 46 performs multiplication by a gain value a. The output SSA(=Y) of the magnetic sensor 40 is given by Expression (1) or Expression (2) below.

$$Y = a \cdot X + b \quad (1)$$

$$Y = a(X+b) \quad (2)$$

The gain value a and the bias value b of the magnetic sensor 40 are set internally in the magnetic sensor 40 by the CPU 220. By setting the gain value a and the bias value b to appropriate values, it is possible to correct the sensor output SSA to a desirable waveform shape.

Figure 8:
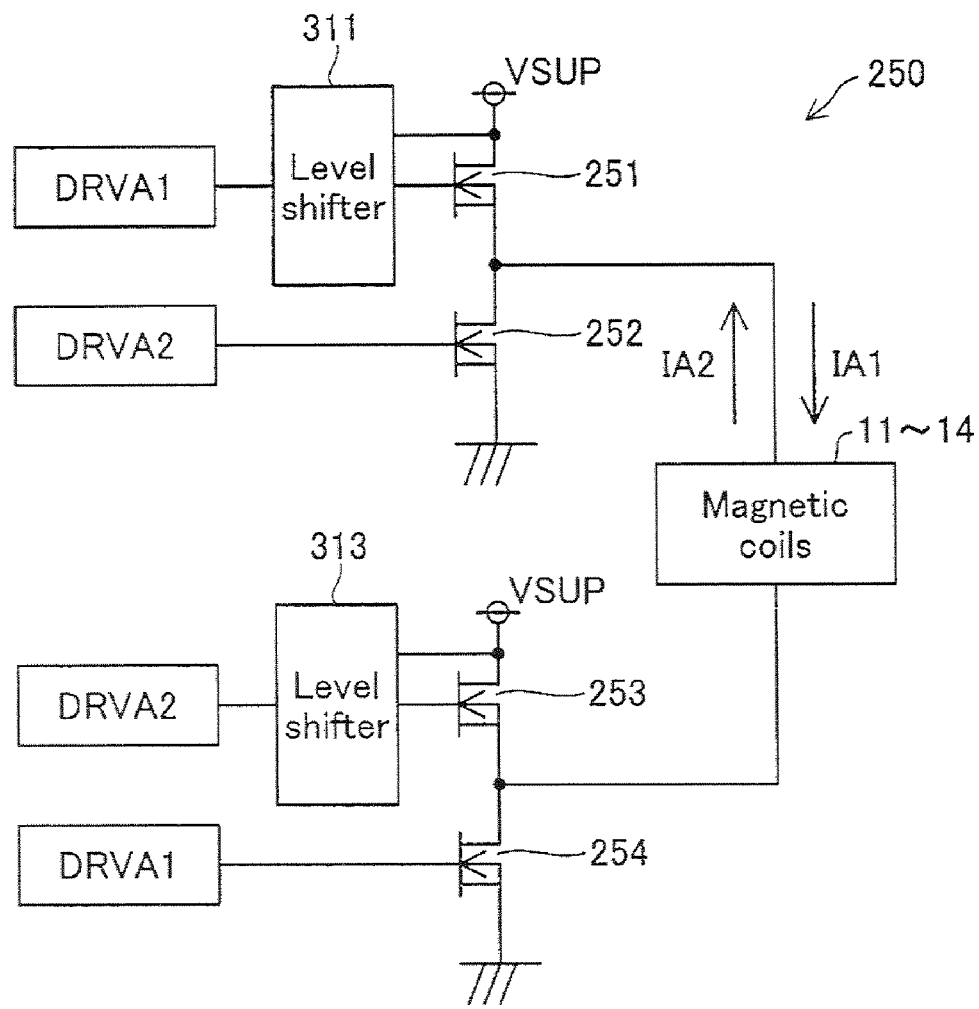
FIG. 8 depicts an internal configuration of a driver circuit.

FIG. 8 depicts the internal configuration of the driver circuit 250. This driver circuit 250 has four transistors 251 through 254 which make up an H bridge circuit. Level shifters 311, 313 are disposed in front of the gate electrodes of the upper arm transistors 251, 253. However, the level shifters may be omitted. The transistors 251 through 254 of the driver circuit 250 go on and off depending on drive signals DRVA1, DRVA2 which function as switching signals, as a result of which supply voltage VSUP is supplied intermittently to the magnet coils 11 through 14. The arrows labeled IA1 and IA2 respectively indicate the direction of current flow with the drive signals DRVA1, DRVA2 at H level. It is possible to employ circuits of various other configuration composed of multiple switching elements as the driver circuit.

Figure 9A:
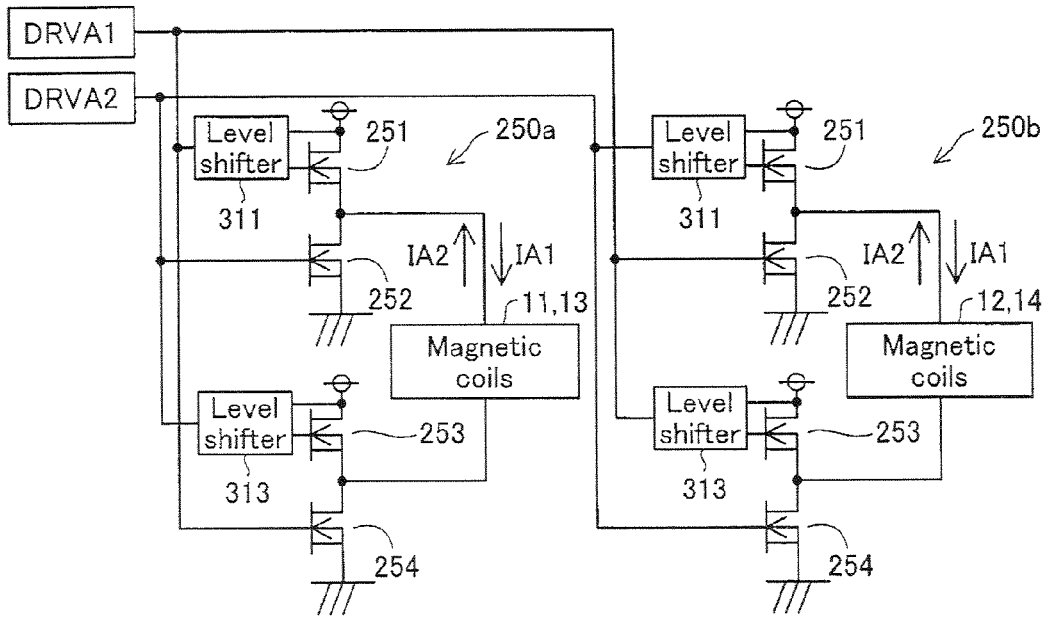
FIGS. 9A to 9C are illustrations of another configuration and operation of a driver circuit.
Figure 9B:
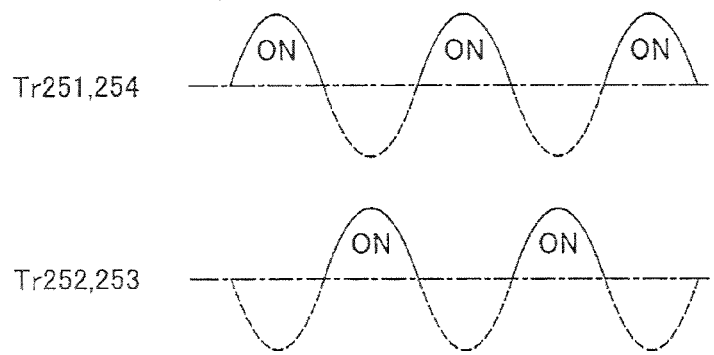
Figure 9C:
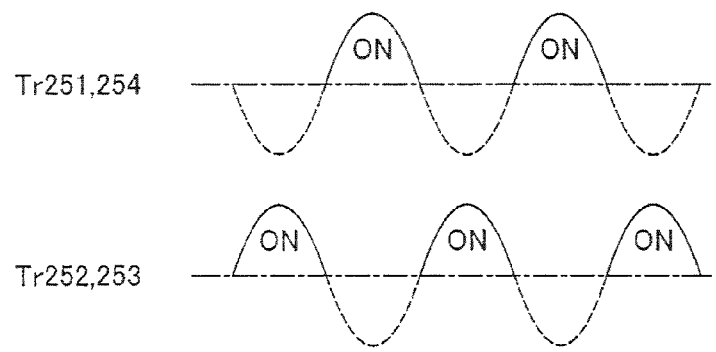
Figure 10A:
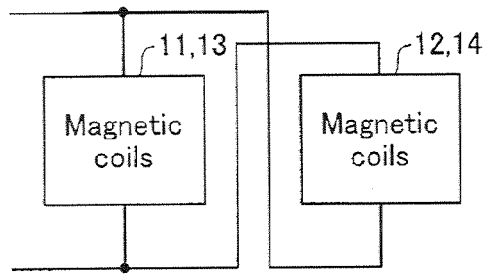
FIGS. 10A to 10D are illustrations of various winding configurations for the magnetic coils.
Figure 10B:
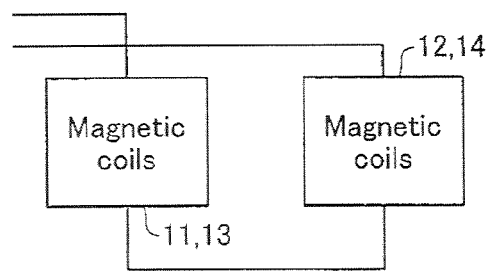
Figure 10C:
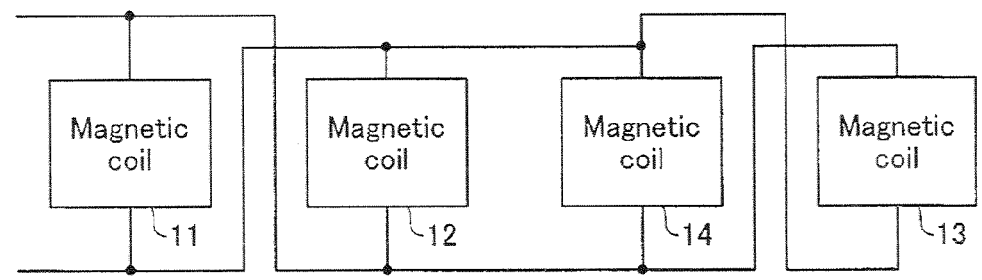
Figure 10D:
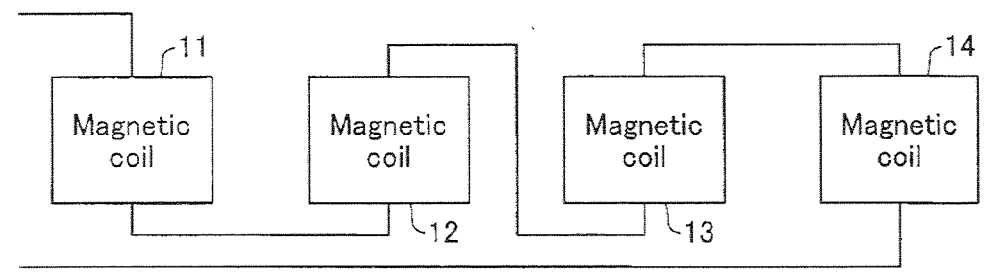

FIGS. 9A to 9C are illustrations of another configuration and operation of a driver circuit. This driver circuit is composed of a first bridge circuit 250a for use with a first set of magnet coils 11, 13; and a second bridge circuit 250b for use with a second set of magnet coils 12, 14. Each of the bridge circuits 250a, 250b is composed of four transistors 251 through 254, the configuration thereof being identical to that shown in FIG. 8. Level shifters 311, 313 are disposed in front of the gate electrodes of the upper arm transistors 251, 253. However, the level shifters may be omitted. In the first bridge circuit 250a, the first drive signal DRVA1 is supplied to the transistors 251, 254, while the second drive signal DRVA2 is supplied to the other transistors 252, 253. On the other hand, in the second bridge circuit 250b, conversely, the first drive signal DRVA1 is supplied to the transistors 252, 253, while the second drive signal DRVA2 is supplied to the other transistors 251, 254. As a result, operations of the first bridge circuit 250a and the second bridge circuit 250b is the reverse of one another as shown in FIG. 9B and FIG. 9C. Consequently, the first set of magnet coils 11, 13 driven by the first bridge circuit 250a and the second set of magnet coils 12, 14 driven by the second bridge circuit 250b are phase shifted by π with respect to each other. Meanwhile, in the circuit shown in FIG. 8, the winding configuration of the first coils 11, 13 is the reverse of the winding configuration of the second coils 12, 14, and the two sets are phase shifted by π through this winding configuration. In this way, both the driver circuit of FIG. 8 and the driver circuit of FIG. 9A have the identical feature that two sets of coils are phase shifted by π with respect to each other; and both afford a single-phase motor.

FIGS. 10A to 10D are illustrations of various winding configurations for the magnetic coils 11-14. By engineering the winding configuration as in these examples, it is possible for adjacent coils to always be excited in opposite directions.

FIGS. 11A to 11E is an illustration depicting internal configuration and operation of the drive signal generator 240 (FIG. 7A). The drive signal generator 240 includes a basic clock generating circuit 510, a 1/N frequency divider 520, a PWM unit 530, a forward/reverse direction value register 540, a multiplier 550, an encoder 560, an AD converter 570, a voltage control value register 580, a voltage comparator 585, and an excitation interval signal generator 590.

The basic clock generating circuit 510 is a circuit that generates a clock signal PCL of prescribed frequency, and is composed of a PLL circuit for example. The frequency divider 520 generates a clock signal SDC having a frequency equal to the frequency of the clock signal PCL divided by N. The value of N is set to a prescribed constant. This value of N has been previously established in the frequency divider 520 by the CPU 220. The PWM unit 530 generates the AC single-phase drive signals DRVA1, DRVA2 (FIG. 7A) in response to the clock signals PCL, SDC, a multiplication value Ma supplied by the multiplier 550, a forward/reverse direction value RI supplied by the forward/reverse direction value register 540, a positive/negative sign signal Pa supplied by the encoder 560, and an excitation interval signal Ea supplied by the excitation interval signal generator 590. The excitation interval signal generator 590 generates the excitation interval signal Ea on the basis of an excitation ratio signal Er supplied by the excitation ratio signal generator 700. These operations will be discussed later.

A value RI indicating the direction for motor rotation is established in the forward/reverse direction register 540, by the CPU 220. In the present embodiment, the motor will rotate forward when the forward/reverse direction value RI is L level, and rotate in reverse rotation when H level. The other signals Ma, Pa, Ea supplied to the PWM unit 530 are determined as follows.

The output SSA of the magnetic sensor 40 is supplied to the AD converter 570. This sensor output SSA has a range, for example, of from GND (ground potential) to VDD (power supply voltage), with the middle point thereof (=VDD/2) being the middle point of the output waveform, or the point at which the sine wave passes through the origin. The AD converter 570 performs AD conversion of this sensor output SSA to generate a digital value of sensor output. The output of the AD converter 570 has a range, for example, of FFh to 0h (the "h" suffix denotes hexadecimal), with the median value of 80h corresponding to the middle point of the sensor waveform.

The encoder 560 converts the range of the sensor output value subsequent to the AD conversion, and sets the value of the middle point of the sensor output value to 0. As a result, the sensor output value Xa generated by the encoder 560 assumes a prescribed range on the positive side (e.g. between +127 and 0) and a prescribed range on the negative side (e.g. between 0 and −127). However, the value supplied to the multiplier 550 by the encoder 560 is the absolute value of the sensor output value Xa; the positive/negative sign thereof is supplied to the PWM unit 530 as the positive/negative sign signal Pa.

The voltage control value register 580 stores a voltage control value Ya established by the CPU 220. This voltage control value Ya, together with the excitation interval signal Ea discussed later, functions as a value for setting the application voltage to the motor. The value Ya can assume a value between 0 and 1.0, for example. Assuming an instance where the excitation interval signal Ea has been set with no non-excitation intervals provided so that all of the intervals are excitation intervals, Ya=0 will mean that the application voltage is zero, and Ya=1.0 will mean that the application voltage is at maximum value. The multiplier 550 performs multiplication of the voltage control value Ya and the sensor output value Xa output from the encoder 560 and conversion to an integer; the multiplication value Ma thereof is supplied to the PWM unit 530.

FIGS. 11B to 11E depict operation of the PWM unit 530 in instances where the multiplication value Ma takes various different values. Here, it is assumed that there are no non-excitation intervals, so that all intervals are excitation intervals. The PWM unit 530 is a circuit that, during one period of the clock signal SDC, generates one pulse with a duty factor of Ma/N. Specifically, as shown in FIGS. 11B to 11E, the pulse duty factor of the single-phase drive signals DRVA1, DRVA2 increases in association with increase of the multiplication value Ma. The first drive signal DRVA1 is a signal that generates a pulse only when the sensor output SSA is positive and the second drive signal DRVA2 is a signal that generates a pulse only when the sensor output SSA is positive; in FIGS. 11B to 11E, both are shown together. For convenience, the second drive signal DRVA2 is shown in the form of pulses on the negative side.

FIGS. 12A to 12C depict correspondence between sensor output waveform and waveform of the drive signals generated by the PWM unit 530. In the drawing, "Hiz" denotes a state of high impedance where the magnetic coils are not excited. As described in FIGS. 11B to 11E, the single-phase drive signals DRVA1, DRVA2 are generated by PWM control using the analog waveform of the sensor output SSA. Consequently, using these single-phase drive signals DRVA1, DRVA2 it is possible to supply to the coils effective voltage that exhibits changes in level corresponding to change in the sensor outputs SSA, SSB.

The PWM unit 530 is constructed such that drive signals DRVA1, DRVA2 are output only during the excitation intervals indicated by the excitation interval signal Ea supplied by the excitation interval signal generator 590, with no drive signals DRVA1, DRVA2 being output at intervals except for the excitation intervals (non-excitation intervals). FIG. 12C depicts drive signal waveforms produced in the case where excitation intervals EP and non-excitation intervals NEP have been established by the excitation interval signal Ea. During the excitation intervals EP, the drive signal pulses of FIG. 12B are generated as is; during the non-excitation intervals NEP, no pulses are generated. By establishing excitation intervals EP and non-excitation intervals NEP in this way, voltage will not be applied to the coils in proximity to the middle point of the back electromotive force waveform (i.e. in proximity to the middle point of the sensor output), thus making possible further improvement of motor efficiency. Preferably the excitation intervals EP will be established at intervals symmetric about the peak point of the back electromotive force waveform; and preferably the non-excitation intervals NEP will be established in intervals symmetric about the middle point (center) of the back electromotive force waveform.

As discussed previously, if the voltage control value Ya is set to a value less than 1, the multiplication value Ma will be decreased in proportion to the voltage control value Ya. Consequently, effective adjustment of application voltage is possible by the voltage control value Ya as well.

As will be apparent from the preceding discussion, with the motor of the present embodiment, it is possible to adjust the application voltage using both the voltage control value Ya and the excitation interval signal Ea. In preferred practice, relationships between the desired application voltage, the voltage control value Ya, and excitation interval signal Ea, will be stored in advance in table format in memory in the drive control circuit 200 (FIG. 7A). By so doing, when the drive control circuit 200 has received a target value for the desired application voltage from the outside, it will be possible for the CPU 220 in response to the target value to set the voltage control value Ya and the excitation interval signal Ea in the drive signal generator 240. Adjustment of application voltage does not require the use of both the voltage control value Ya and the excitation interval signal Ea, and it would be acceptable to use either one of them instead.

Figure 13:
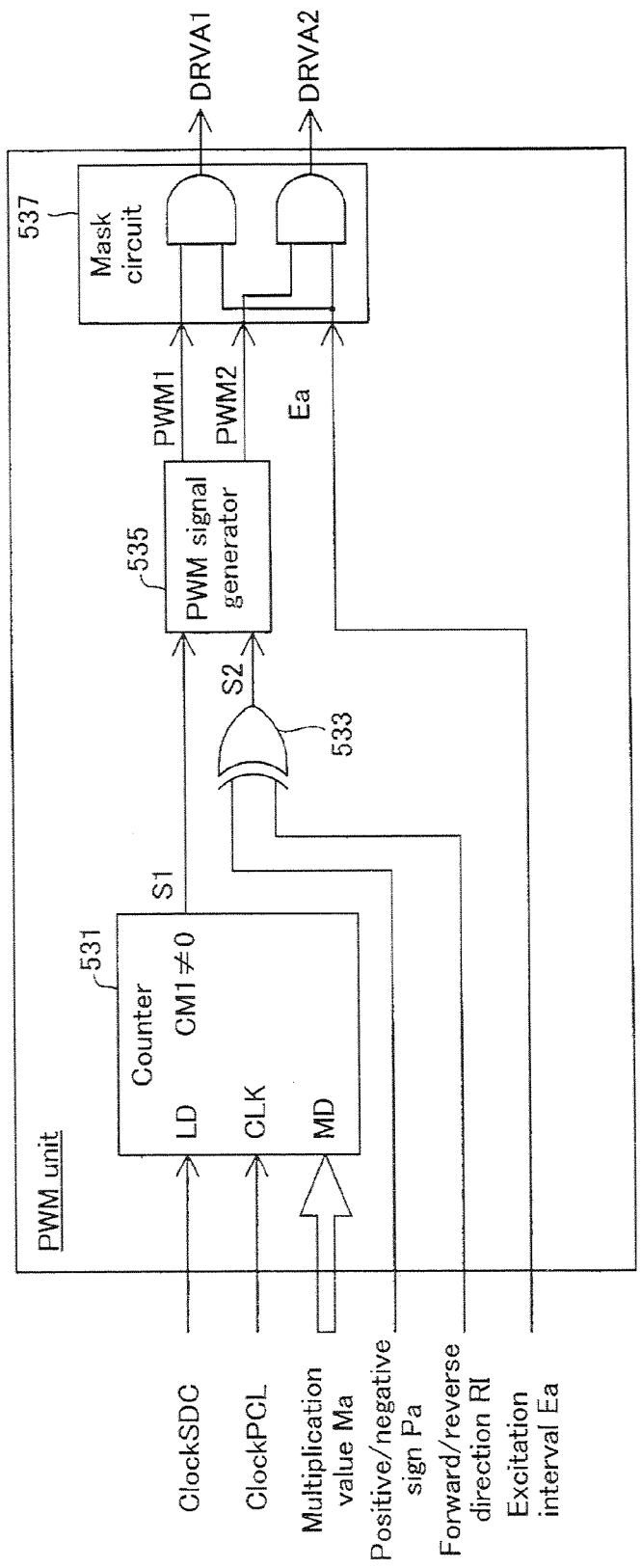
FIG. 13 is a block diagram depicting an example of internal configuration of the PWM unit.

FIG. 13 is a block diagram depicting an example of internal configuration of the PWM unit 530 (FIG. 11A). The PWM unit 530 has a counter 531, an EXOR circuit 533, a PWM signal generator 535, and a mask circuit 537. Their operation will be described below.

Figure 14:
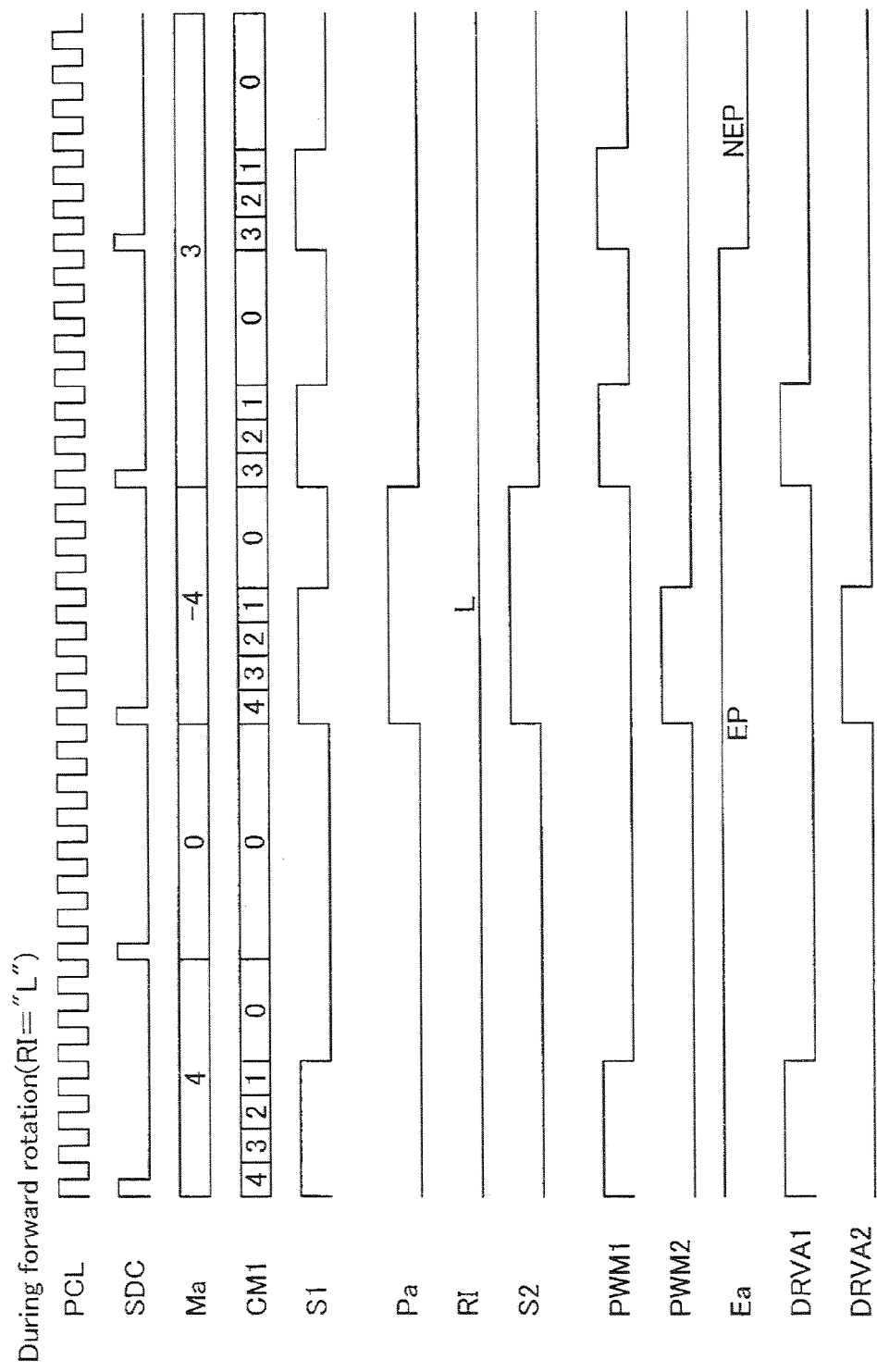
FIG. 14 is a timing chart depicting operation of the PWM unit during forward rotation of the motor.

FIG. 14 is a timing chart depicting operation of the PWM unit 530 during forward rotation of the motor. In FIG. 14 are shown the two clock signals PCL and SDC, the multiplication value Ma, the count value CM1 in the counter 531, the output S1 of the counter 531, the positive/negative sign signal Pa, the forward/reverse direction value RI, the output S2 of the EXOR circuit 533, the output signals PWM1, PWM2 of the PWM signal generator 535, the excitation interval signal Ea, and the output signals DRVA1, DRVA2 of the mask circuit 537. For each one cycle of the clock signal SDC, the counter 531 repeats the operation of counting down the count value CM1 to 0 in synchronization with the clock signal PCL. The initial value of the count value CM1 is set to the multiplication value Ma. In FIG. 14 for convenience in illustration, negative multiplication values Ma are shown as well; however, the counter 531 uses the absolute values |Ma| thereof. The output S1 of the counter 531 is set to High level when the count value CM1 is not 0, and drops to Low level when the count value CM1 is 0.

The EXOR circuit 533 outputs a signal S2 that represents the exclusive OR of the positive/negative sign signal Pa and the forward/reverse direction value RI. In the case of forward rotation of the motor, the forward/reverse direction value RI is Low level. Consequently, the output S2 of the EXOR circuit 533 is a signal identical to the positive/negative sign signal Pa. The PWM signal generator 535 generates the PWM signals PWM1, PWM2 from the output S1 of the counter 531 and the output S2 of the EXOR circuit 533. Specifically, in the output S1 of the counter 531, the signal during intervals in which the output S2 of the EXOR circuit 533 is Low level is output as the first PWM signal PWM1, and the signal during intervals in which the output S2 is High level is output as the second PWM signal PWM2. The mask circuit 537 includes two AND circuits; it outputs a drive signal DRVA1 representing the logical AND of the excitation interval signal Ea and the PWM signal PWM1, and a drive signal DRVA2 representing the logical AND of the excitation interval signal Ea and the PWM signal PWM2. In proximity to the right edge in FIG. 14, the excitation interval signal Ea falls to Low level, thereby establishing a non-excitation interval NEP. Consequently, during this non-excitation interval NEP, neither of the drive signals DRVA1, DRVA2 is output, and a state of high impedance is maintained.

The PWM signal generator 535 (FIG. 13) corresponds to the original drive signal generator in the present invention; the mask circuit 537 (FIG. 13) has the function of a drive signal shaping circuit for shaping the original drive signals, i.e. the PWM signals PWM1, 2, according to the excitation interval signal Ea.

Figure 15:
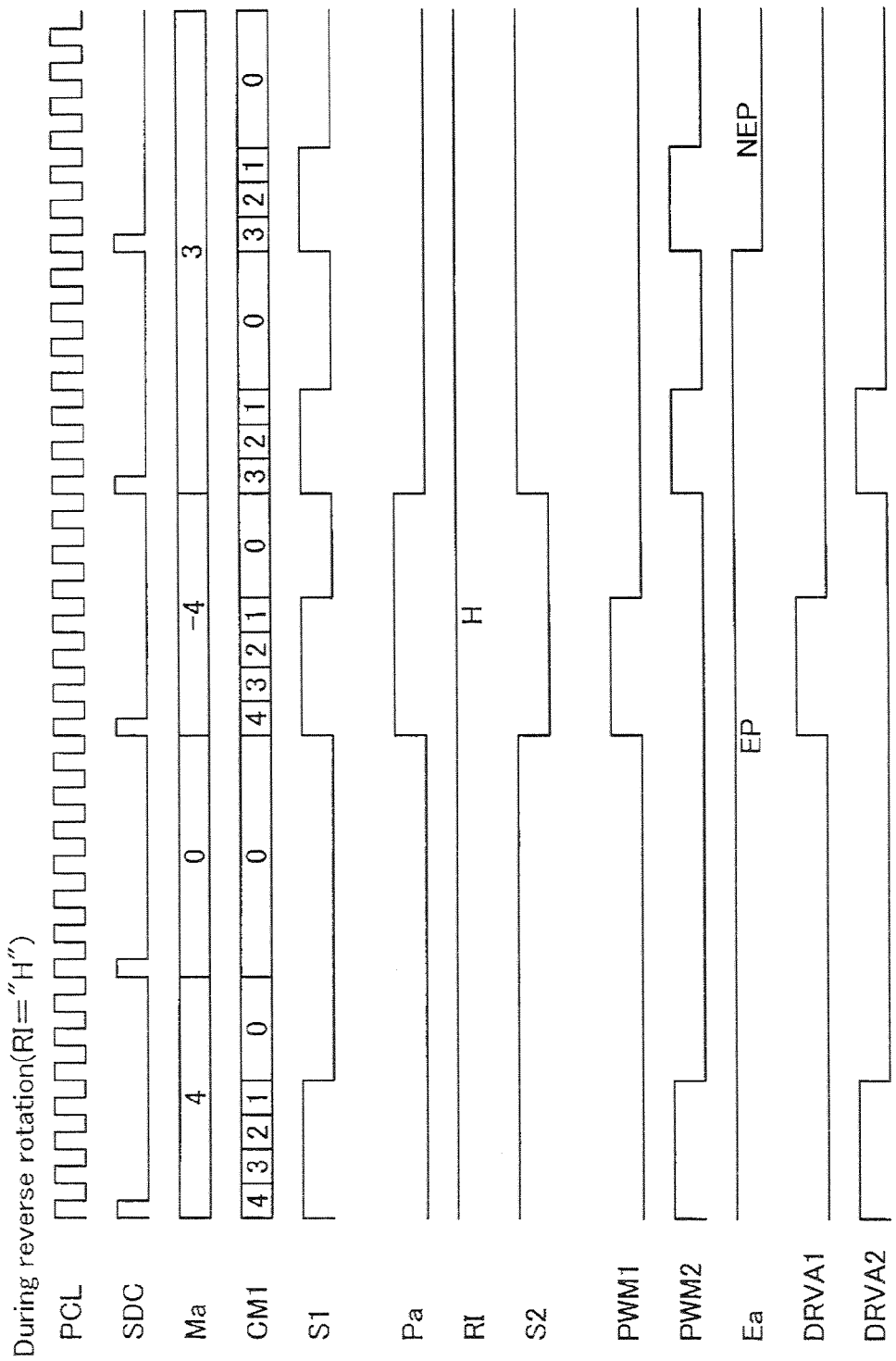
FIG. 15 is a timing chart depicting operation of the PWM unit during reverse rotation of the motor.

FIG. 15 is a timing chart depicting operation of the PWM unit 530 during reverse rotation of the motor. During reverse rotation of the motor, the forward/reverse direction value RI is set to High level. As a result, the two drive signals DRVA1, DRVA2 switch relative to FIG. 14; it is appreciated that the motor runs in reverse as a result.

Figure 16:
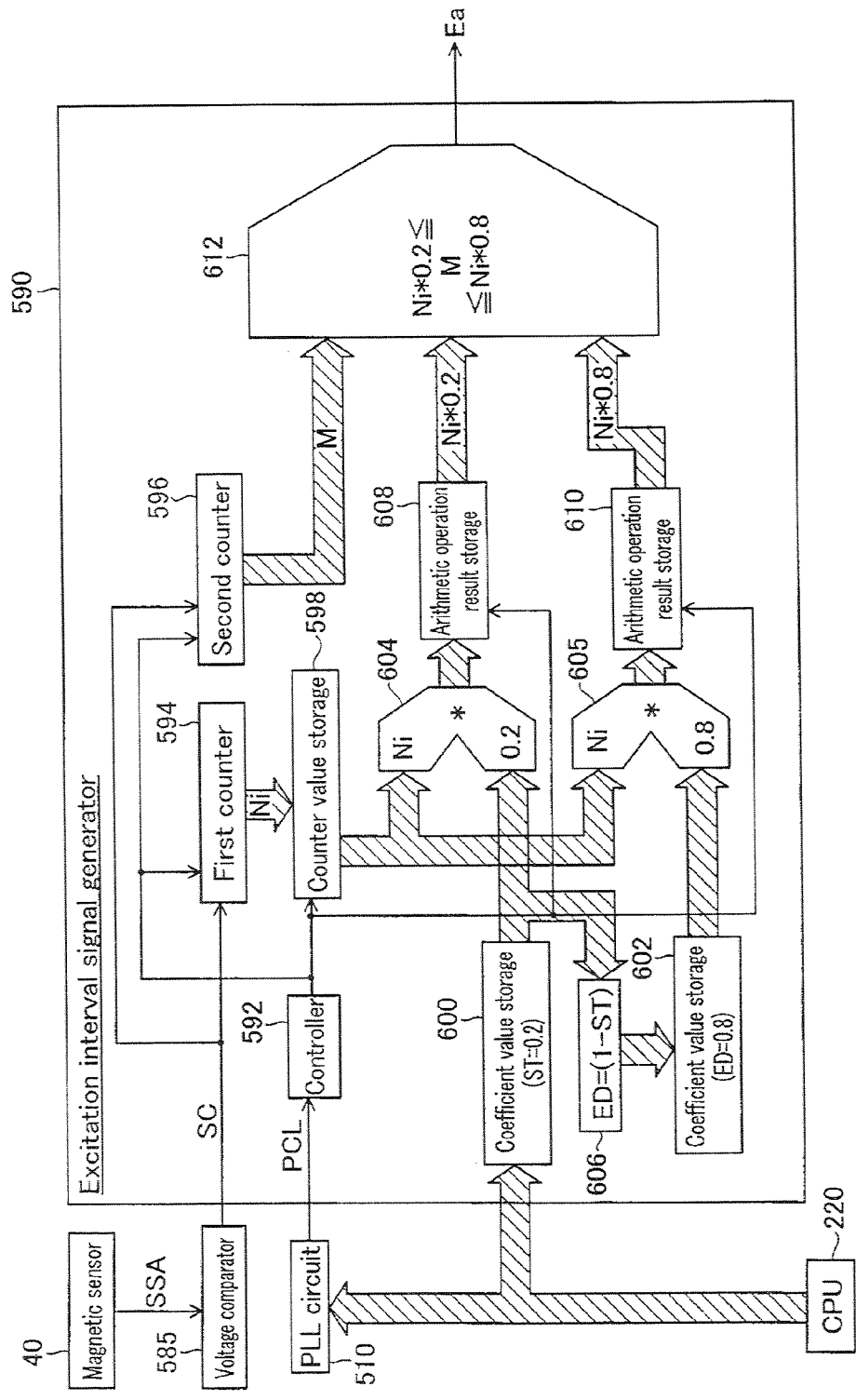
FIG. 16 is a block diagram depicting configuration of an excitation interval signal generator.

FIG. 16 is a block diagram depicting the configuration of the excitation interval signal generator 590. In FIG. 16, the magnetic sensor 40, the voltage comparator 585, the PLL circuit 510, and the CPU 220 (FIG. 11A) are shown, in addition to the excitation interval signal generator 590. The excitation interval signal generator 590 has a controller 592, a first counter 594, a second counter 596, a counter value storage 598, and two coefficient value storages 600, 602. The excitation interval signal generator 590 further includes two multiplier circuits 604, 605, an arithmetic circuit 606, two arithmetic operation result storages 608, 610, and a comparator circuit 612. The PLL circuit 510 generates a clock signal PCL which is used internally by the excitation interval signal generator 590. The controller 592 supplies this clock signal PCL to the counters 594, 596, as well as supplying appropriate hold timing (latch timing) to the counter value storage 598 and the arithmetic operation result storages 608, 610.

Figure 17:
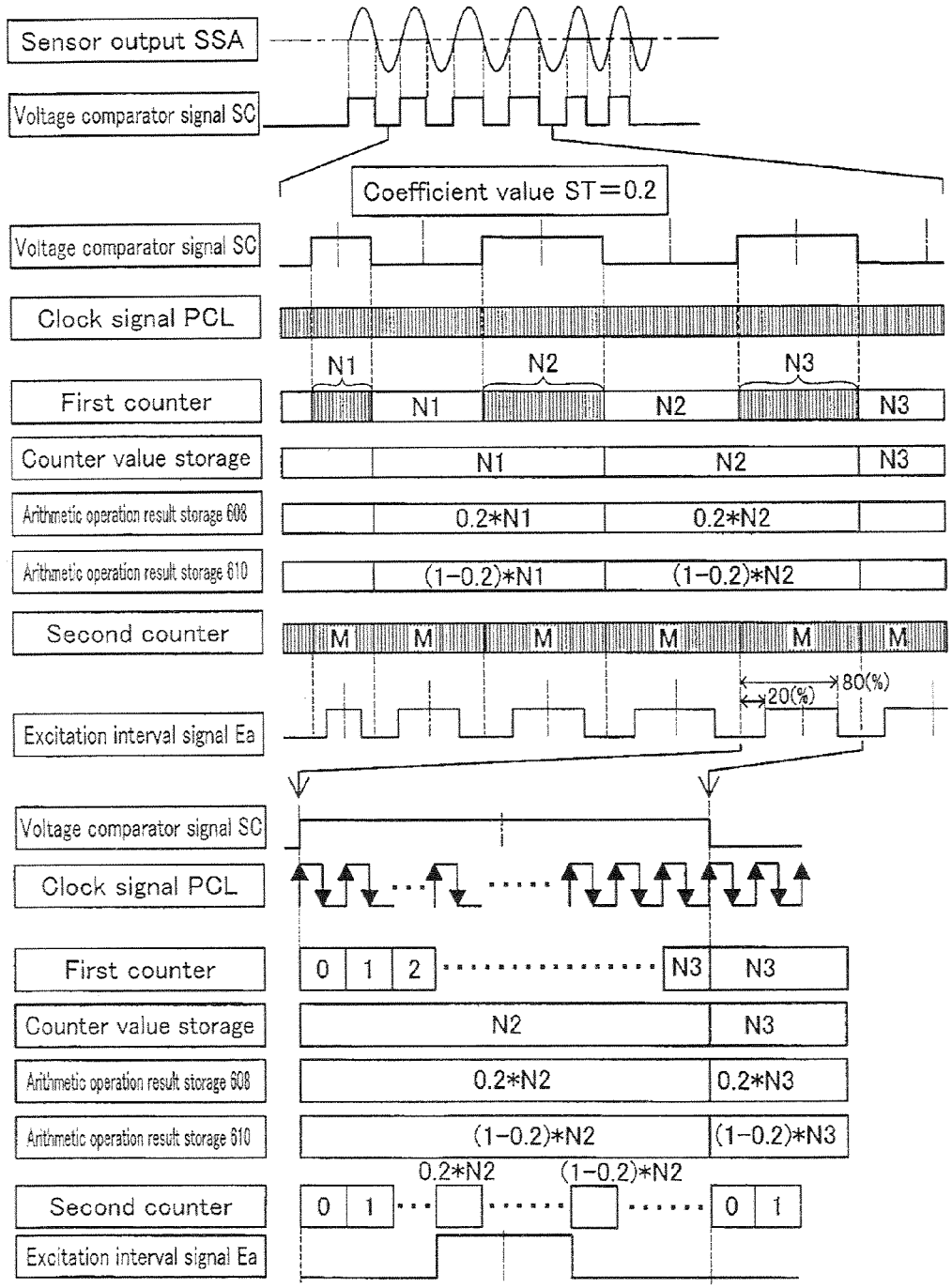
FIG. 17 is a timing chart depicting operation of the excitation interval signal generator.

FIG. 17 is a timing chart depicting operation of the excitation interval signal generator 590. First, the voltage comparator 585 compares the signal SSA (analog) from the magnetic sensor 40 with a reference signal (not shown), and generates a voltage comparator signal SC which is a digital signal. In preferred practice, the level of the reference signal is set to the median value of the levels assumable the sensor signal SSA. On the basis of the clock signal PCL supplied by the controller 592, the first counter 594 counts the number of clock pulses during the interval for which the voltage comparator signal SC shows High level. Specifically, the first counter 594 starts the count at the timing at which the voltage comparator signal SC rises from Low level to High level; and at the timing at which the voltage comparator signal SC shows Low level, and saves the counter value Ni (where i is cycle number) at that time to the counter value storage 598. Subsequently, at the timing at which the voltage comparator signal SC again shows High level in the next cycle, the first counter 594 resets the internal counter value Ni to 0, and during the interval that the voltage comparator signal SC shows High level again counts the number of clock pulses as a counter value N(i+1). Then, at the timing at which the voltage comparator signal SC shows Low level, first counter 594 writes the counter value N(i+1) at that time to the counter value storage 598, overwriting the old value.

The first coefficient value storage 600 (FIG. 16) stores an coefficient value ST which has been set by the CPU 220. In the example of FIG. 16 and FIG. 17, the coefficient value ST=0.2. The arithmetic circuit 606 subtracts the coefficient value ST stored in the coefficient value ST storage 600 from 1, and saves the arithmetic operation result (coefficient value ED=1−ST) obtained thereby to the second coefficient value storage 602. The first multiplier circuit 604 multiplies the counter value Ni stored in the counter value storage 598 by the coefficient value ST stored in the first coefficient value storage 600, and saves the arithmetic operation result (=Ni×ST) obtained thereby to the first arithmetic operation result storage 608. The second multiplier circuit 605 multiplies the counter value Ni stored in the counter value storage 598 by the coefficient value ED stored in the second coefficient value storage 602, and saves the arithmetic operation result (=Ni× ED) obtained thereby to the second arithmetic operation result storage 610.

On the basis of the clock signal PCL supplied from the controller 592, the second counter 596 starts counting the number of clock pulses from the timing at which the voltage comparator signal SC shows High level; and terminates the count at timing at which the signal shows Low level. Then the second counter 596 reset to the counter value to 0; and starts counting the number of clock pulses from the timing at which the voltage comparator signal SC shows Low level; and terminates the count at timing at which the signal shows High level. These counter values M are input sequentially to the comparator circuit 612.

The comparator circuit 612 is a window comparator which generates and outputs the excitation interval signal Ea. Specifically, the arithmetic operation result (=Ni×ST) which is saved to the first arithmetic operation result storage 608 is compared with the second counter values M input sequentially from the second counter 596; and at the timing at which these values match the excitation interval signal Ea is brought to High level. Then, the arithmetic operation result (=Ni×ED) which is saved to the second arithmetic operation result storage 610 is compared with the second counter values M input sequentially from the second counter 596; and at the timing at which these values match the excitation interval signal Ea is brought to Low level. The excitation interval signal Ea is output by a process analogous to the above, even during the interval that the voltage comparator signal SC shows Low level.

As is understood from FIG. 17, the excitation interval signal generator 590 counts the High level interval of the voltage comparator signal SC, and on the basis of the High level interval determines the start time and end time for the excitation interval signal Ea to show High level in the next cycle. For example, where the coefficent value ST=0.2, start points at which the excitation interval signal Ea goes to High level are time points at which the pre-determined term Ts has elapsed from rising edges and falling edges of the voltage comparator signal SC respectively, where the predetermined term Ts is 0.2×Ta, and Ta is the High level interval of the voltage comparator signal SC of the previous cycle. End points at which the excitation interval signal Ea falls from High level to Low level are time points at which the pre-determined term has elapsed Te from the rising edges and the falling edges of the voltage comparator signal SC respectively, where the pre-determined term Te is 0.8×Ta. Consequently, where the length of the High level interval of the voltage comparator signal SC of the previous cycle is 1, the High level interval of the voltage comparator signal SC of the next cycle is 0.6(=0.8−0.2).

The excitation interval signal generator 590 (FIG. 16) corresponds to the excitation interval setter in the present invention; and the first and second counters 594, 596 correspond to the interval measurer in the present invention. The multiplier circuit 604 corresponds to the start time setter in the present invention, the multiplier circuit 605 corresponds to the end time setter in the present invention, and the comparator circuit 612 corresponds to the excitation interval controller in the present invention. The sensor signal SSA corresponds to the positional signal in the present invention, and the voltage comparator signal SC corresponds to the timing signal in the present invention.

As described above, where the voltage comparator signal SC repeatedly goes on/off precisely at identical cycles, the center position of the High level signal interval of the voltage comparator signal SC and the center position of the High level signal interval of the excitation interval signal Ea substantially match. The center position of the Low level signal interval of the voltage comparator signal SC and the center position of the High level signal interval of the excitation interval signal Ea substantially match as well. That is, the excitation interval EP may be set to a symmetrical interval centered on the peak of the back electromotive force waveform, while the non-excitation interval NEP may be set to a symmetrical interval centered on the midpoint of the back electromotive force waveform. The length of the excitation interval EP may be set at will, where the value of the coefficient value ST is set arbitrarily by the CPU 220.

Figure 18A:
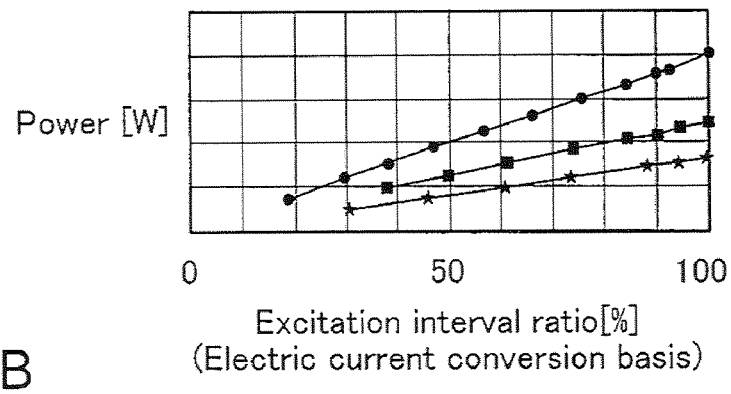
FIGS. 18A to 18C are graphs illustrating the effect where the excitation interval is changed.
Figure 18B:
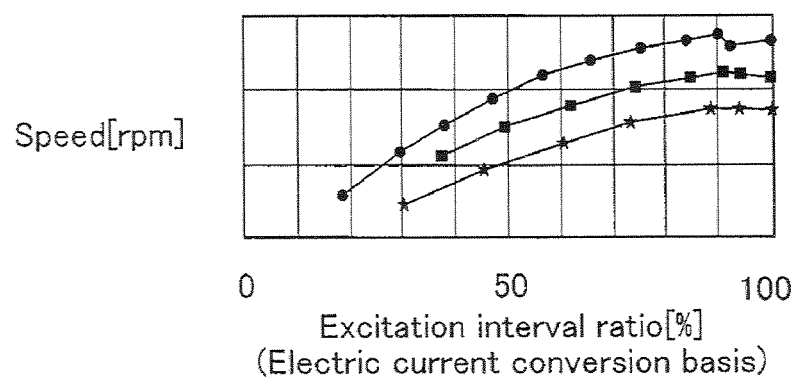
Figure 18C:
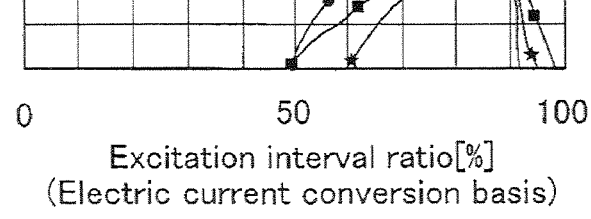

FIGS. 18A to 18C are graphs illustrating the effect where the excitation interval is changed. The excitation interval ratio shown in the drawing refers to the ratio of the High level interval of the excitation interval signal Ea to the High level interval of the voltage comparator signal SC. For example, where the aforementioned coefficient value ST=0.2, the interval for which the excitation interval signal is High level is 0.6 times the interval for which the voltage comparator signal SC is High level, and thus the excitation interval ratio is 60%. The numbers 15 (V), 12 (V), and 10 (V) indicate peak voltage of the PWM signal applied to the coils (i.e. the power supply voltage VSUP of the driver circuit 250 of FIG. 8). The numerical values in FIGS. 18A to 18C are measured with fixed load applied to the motor, in the steady state at constant torque and constant speed. FIG. 18A shows the relationship of excitation interval ratio and power consumption. It is apparent that power consumption may be decreased as the excitation interval ratio decreases. FIG. 18B shows the relationship of excitation interval ratio and rotation speed. It is apparent that as the excitation interval ratio decreases, rotation speed in the steady state decreases as well. However, up to an excitation interval ratio of close to 70%, speed may be maintained even as excitation interval ratio decreases. FIG. 18C shows the extent of reduction in power consumption afforded by the motor in which the excitation interval ratio has been set at various values, compared with the motor in which all intervals are excitation intervals. From FIG. 18C it is apparent that the reduction in power consumption is noticeable in a region where the excitation interval ratio is between 70% and 90%.

In this way, in Embodiment 1, the excitation interval signal Ea may be generated at will by the excitation interval signal generator 590, which is a digital circuit. Since the excitation interval signal generator 590 may be implemented with a digital circuit, it is easy to incorporate excitation interval signal generator 590 into an IC.

B. Embodiment 2

Figure 19:
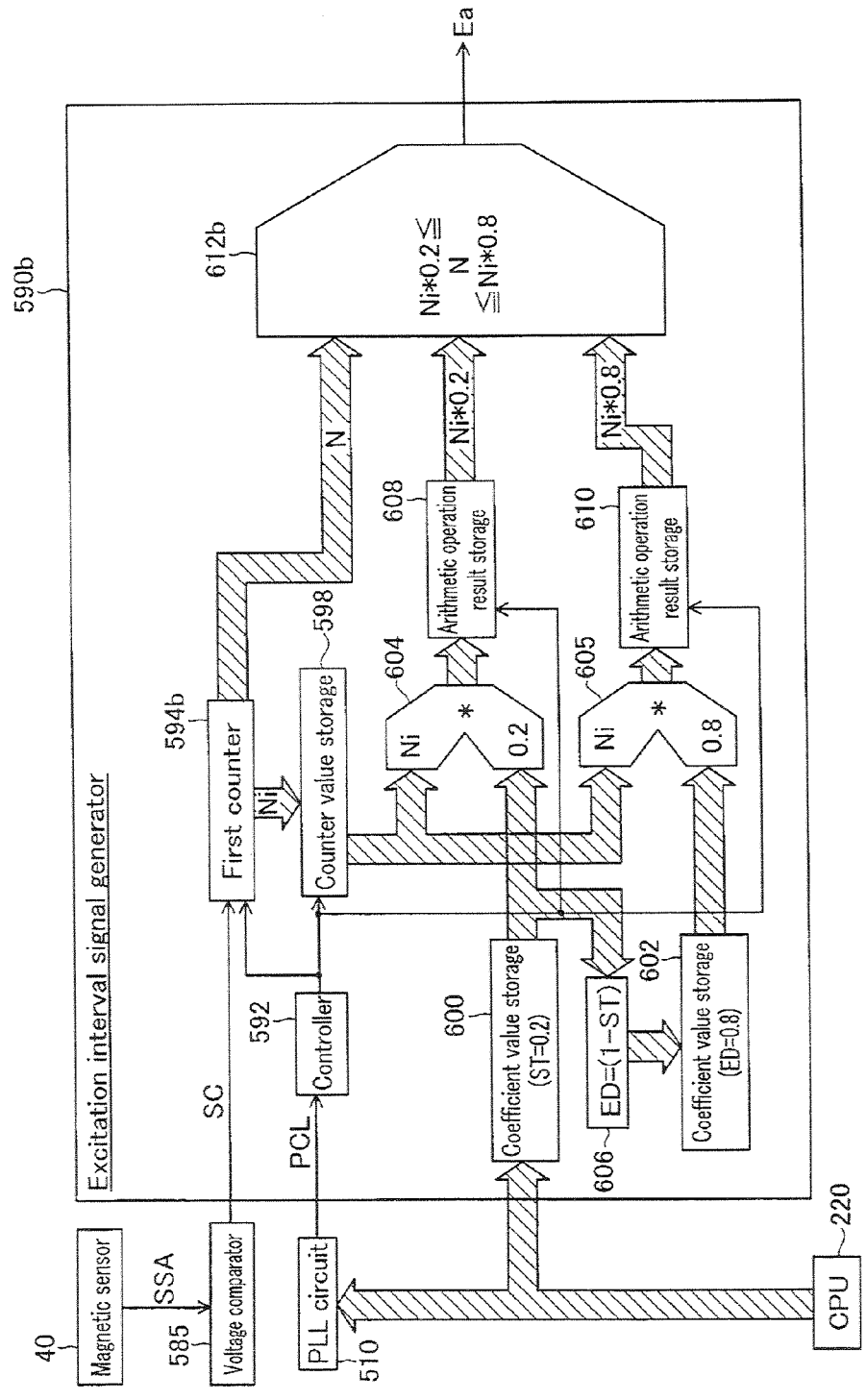
FIG. 19 is an illustration depicting internal configuration of an excitation interval signal generator in embodiment 2.

FIG. 19 is an illustration depicting the configuration of an excitation interval signal generator 590b in embodiment 2. The only differences from Embodiment 1 shown in FIG. 16 are that the second counter 596 is omitted; the first counter 594b has different operation; and there is additional latch timing for the counter value storage 598 and the two arithmetic operation result storages 608, 610; the configuration is otherwise identical to Embodiment 1. The operation of these elements is described below.

Figure 20:
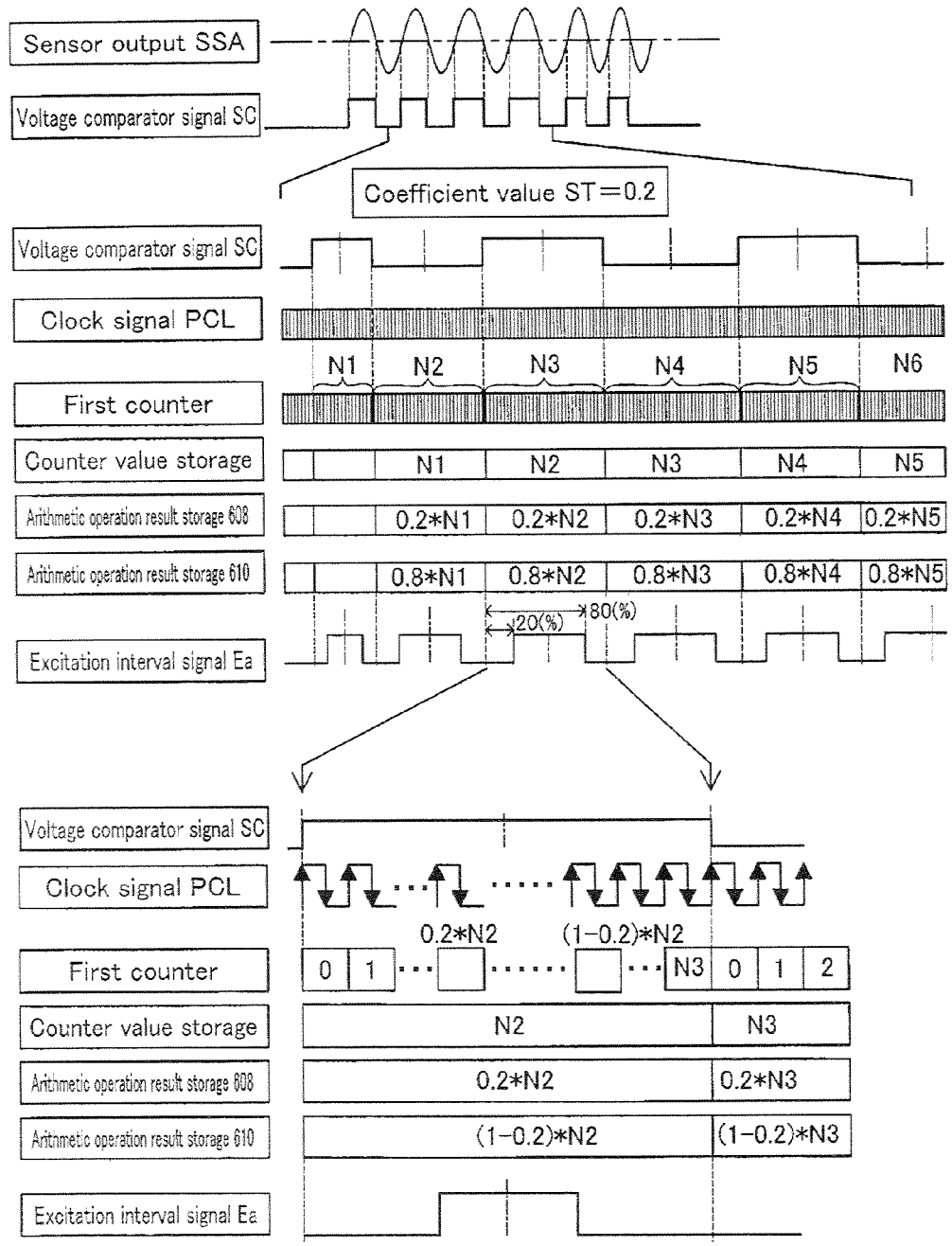
FIG. 20 is a timing chart depicting operation of the excitation interval signal generator in embodiment 2.

FIG. 20 is a timing chart depicting operation of the excitation interval signal generator 590b in Embodiment 2. On the basis of the clock signal PCL supplied by the controller 592, the first counter 594b counts the number of clock pulses during the interval for which the voltage comparator signal SC shows High level, and the number of clock pulses during the interval for which it shows Low level. Specifically, the first counter 594b starts the count at the timing at which the voltage comparator signal EC rises from Low level to High level; and at the timing at which the voltage comparator signal EC shows Low level, saves the counter value Ni (where i is cycle number) at that time to the counter value storage 598. Subsequently, the first counter 594b resets the internal counter value Ni to 0, and during the interval that the voltage comparator signal shows Low level counts the number of clock pulses as a counter value N(i+1). Then, at the timing at which the voltage comparator signal EC shows High level, the first counter 594b writes the counter value N(i+1) at that time to the counter value storage 598, overwriting the old value. The counter values N which varying during the count are input sequentially to the comparator circuit 612b.

The first multiplier circuit 604 multiplies the counter value Ni stored in the counter value storage 598 by the coefficient value ST stored in the first coefficient value storage 600, and saves the arithmetic operation result (=Ni×ST) obtained thereby to the first arithmetic operation result storage 608. The second multiplier circuit 605 multiplies the counter value Ni stored in the counter value storage 598 by the coefficient value ED stored in the second coefficient value storage 602, and saves the arithmetic operation result (=Ni×ED) obtained thereby to the second arithmetic operation result storage 610. In Embodiment 2, the two multiplier circuits 604, 605 perform their arithmetic operations and save the operation results to the arithmetic operation result storages 608, 610 not only at the timing at which the voltage comparator signal SC falls from High level to Low level, but also at the timing of its rise from Low level to High level.

The comparator circuit 612b compares the first counter values N sequentially input from the first counter 594, to the arithmetic operation results (Ni×ST, Ni×ED). The operation of the comparator circuit 612b is otherwise the same as in Embodiment 1.

In this way, the High level signal interval and the Low level signal interval of the voltage comparator signal SC may be counted, and the excitation interval signal Ea may be generated at will the same way as in Embodiment 1 on the basis thereof as well.

C. Embodiment 3

Figure 21:
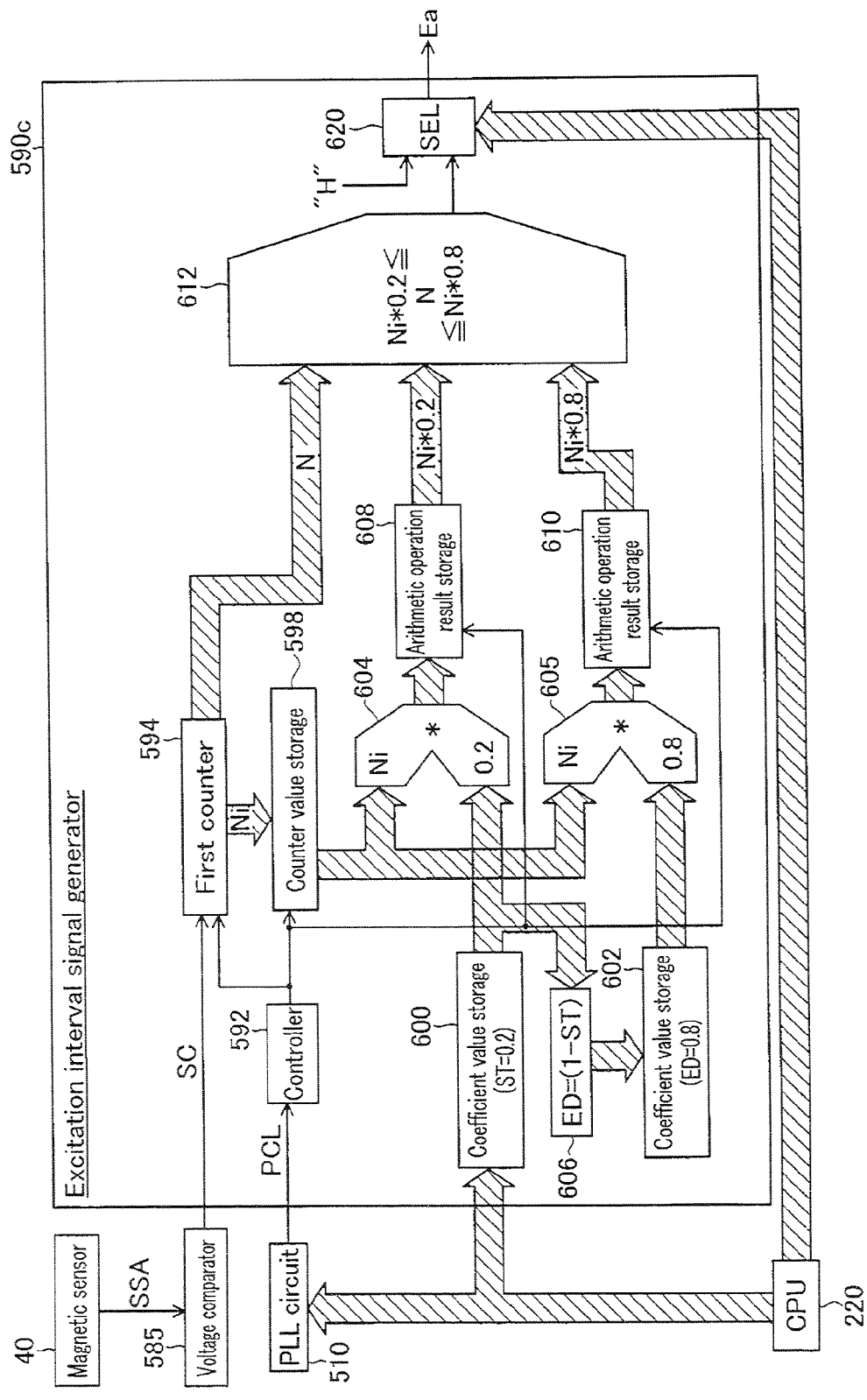
FIG. 21 is an illustration depicting internal configuration of an excitation interval signal generator in embodiment 3.

FIG. 21 is an illustration depicting the configuration of an excitation interval signal generator 590c in embodiment 3. The only differences from Embodiment 1 shown in FIG. 16 are that a selector 620 is added; and the second counter 596 is omitted; the configuration is otherwise identical to Embodiment 1. At motor startup, the selector 620 outputs the excitation interval signal Ea which indicates High level constantly. Then, at the point in time that the motor has reached a prescribed rotation speed or a point in time after a prescribed time has passed, the selector 620 switches signals and outputs a signal by the comparator circuit 612 as the excitation interval signal Ea. The timing of this switch is set in the selector 620 in advance by the CPU 220. The operation of these elements is described below.

Figure 22:
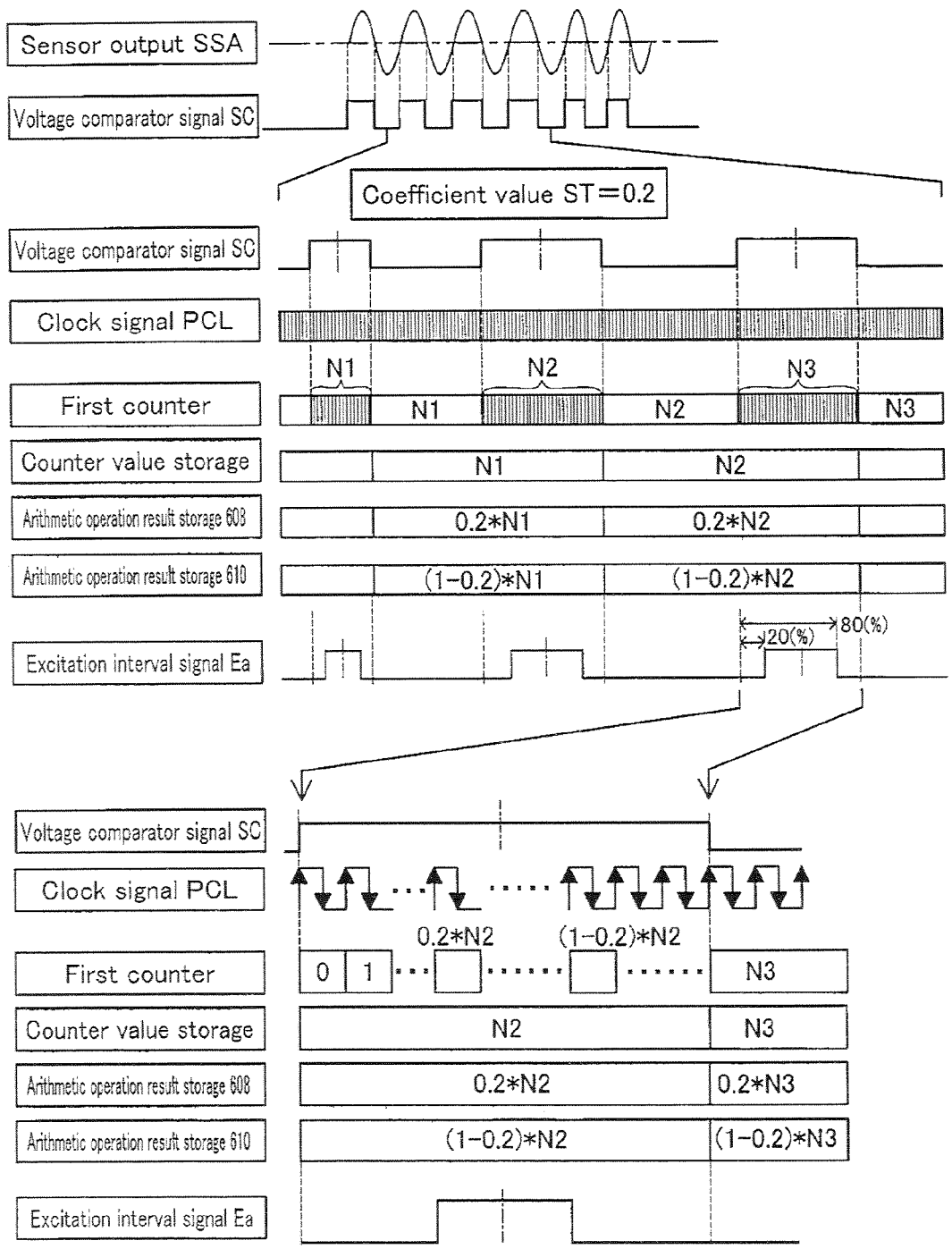
FIG. 22 is a timing chart depicting operation of the excitation interval signal generator in embodiment 3.

FIG. 22 is a timing chart depicting operation of the excitation interval signal generator 590c in Embodiment 3. The only differences from Embodiment 1 shown in FIG. 17 are that the comparator circuit 612 sets the High level interval of the excitation interval signal Ea using the counter value N input from the first counter 594; and that the excitation interval signal Ea shows High level only during intervals for which the voltage comparator signal SC is showing High level; operation is otherwise the same as in Embodiment 1.

It is acceptable in this way to set the entire period to the excitation interval EP during startup which entails considerable load on the motor, and once stabilized at a lower load, to then set the excitation interval EP and the non-excitation interval NEP by the excitation interval signal generator 590c.

D. Embodiment 4

Figure 23:
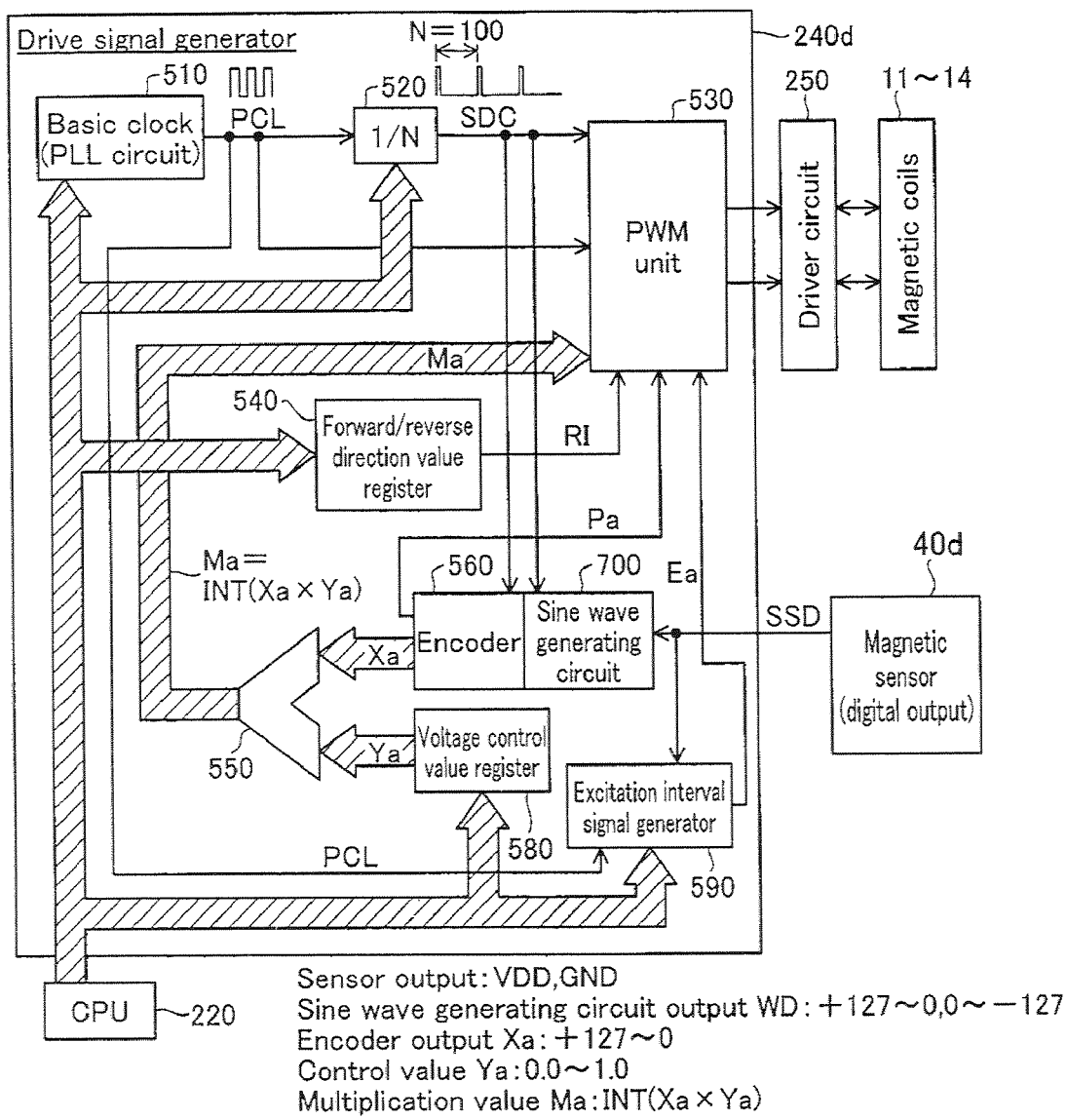
FIG. 23 is an illustration depicting internal configuration of a drive signal generator in embodiment 4.

FIG. 23 is an illustration depicting the internal configuration of a drive signal generator 240d in embodiment 4. The only differences from Embodiment 1 shown in FIG. 11A are that the voltage comparator 585 is omitted; the output SSD of the magnetic sensor 40d is a digital signal; and a sine wave generating circuit 700 is provided for generating a sine wave on the basis of the magnetic sensor output SSD; the configuration is otherwise the same as in Embodiment 1 through Embodiment 3.

The excitation interval signal generator 590 inputs the output SSD (digital binary signal) of the magnetic sensor 40d. This magnetic sensor output SSD and the voltage comparator signal SC used in Embodiment 1 through Embodiment 3 have the shared feature of being cyclical digital signals generated in sync with operation of the electric motor. In this case, the magnetic sensor output SSD corresponds to the positional signal and the timing signal in the present invention. Any of the configurations described in Embodiment 1 through Embodiment 3 may be employed for the excitation interval signal generator 590 in Embodiment 4.

Figure 24A:
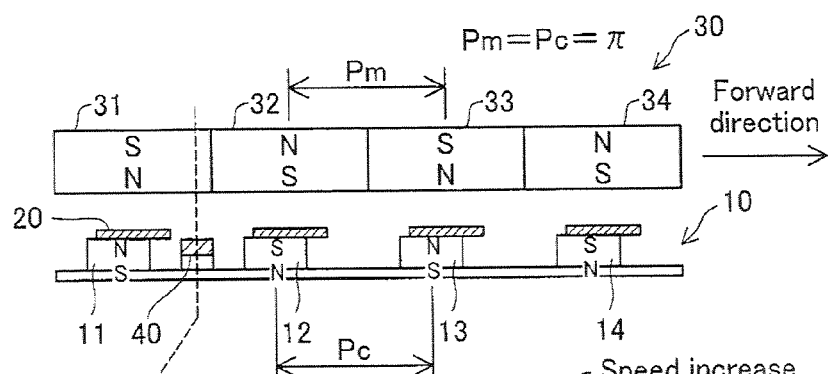
FIGS. 24A to 24D are illustrations depicting the positional relationship of the magnet array and coil array; and relationship of coil back electromotive force waveform, magnetic sensor output, and sine wave generating circuit output.
Figure 24B:
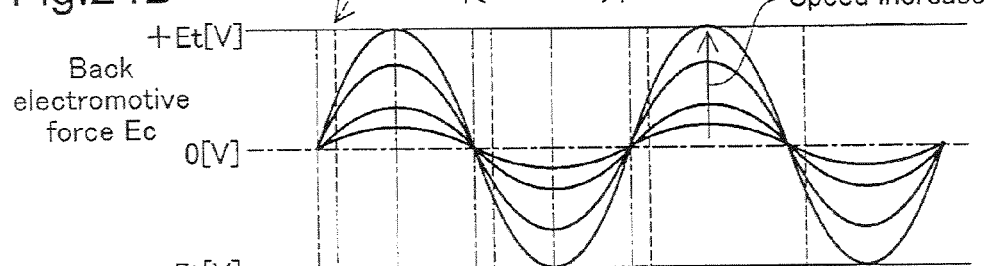
Figure 24C:
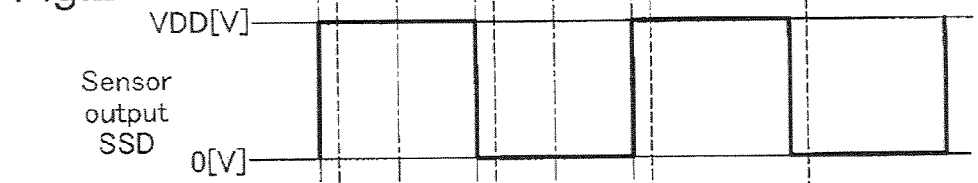
Figure 24D:
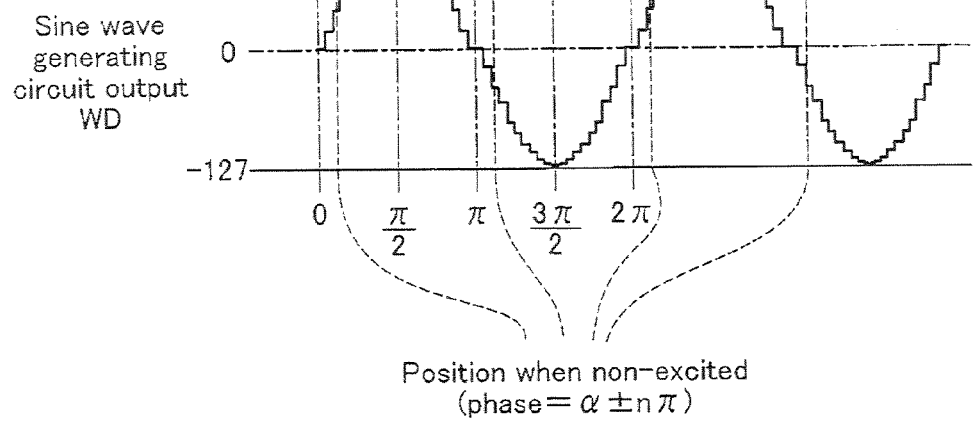

FIG. 24A is an illustration depicting the positional relationship of the magnet array and coil array. FIGS. 24B to 24D are illustrations depicting the relationships of coil back electromotive force waveform, magnetic sensor output, and output of the sine wave generating circuit 700. As shown in FIG. 24C, the magnetic sensor 40d may output a digital signal dependent on the back electromotive force of the coils, and may be implemented with a Hall IC with digital output, for example. As shown in FIG. 24D, the sine wave generating circuit 700 outputs a digital sine wave synchronized with the sensor output SSD.

Figure 25:
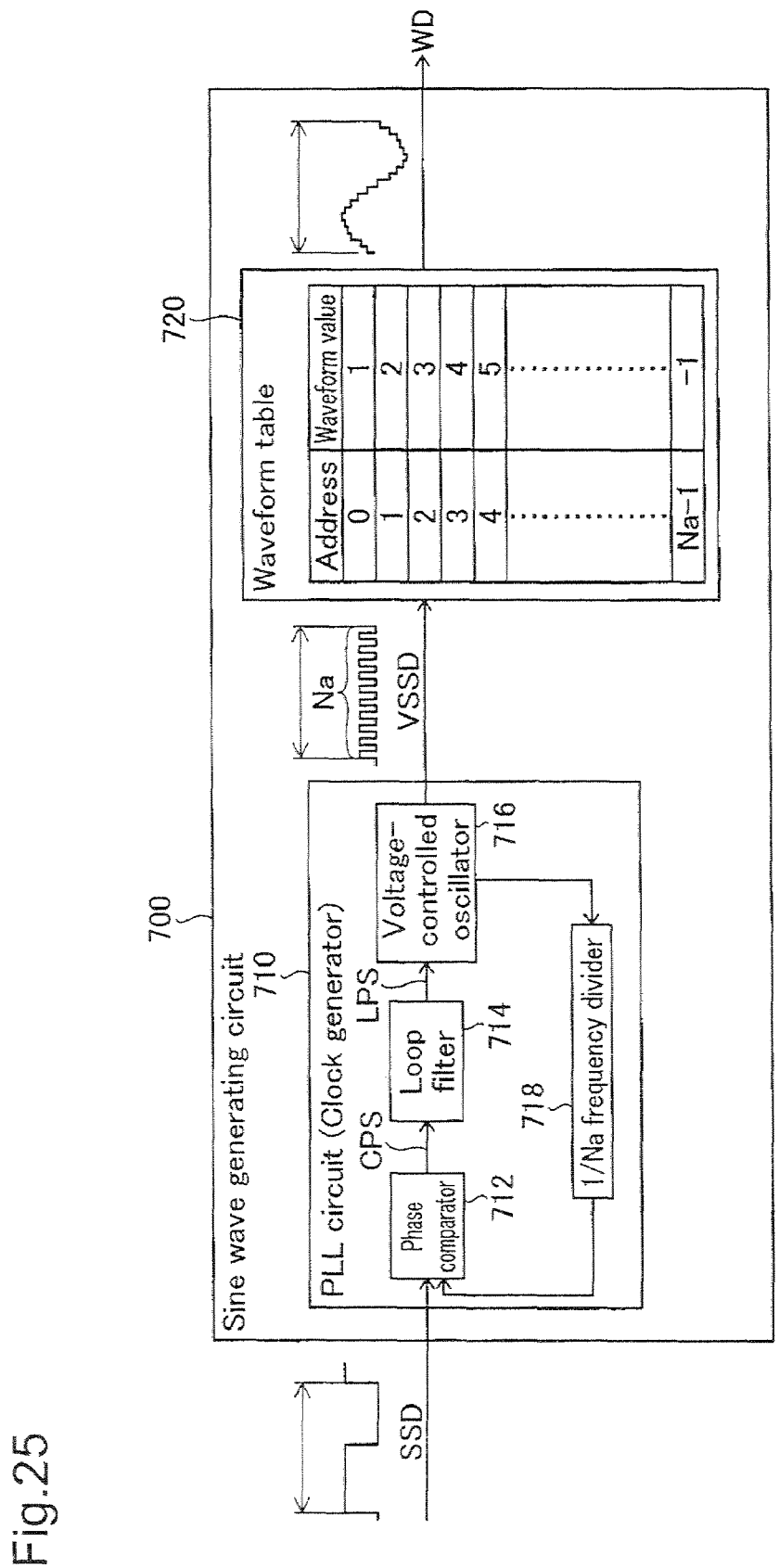
FIG. 25 is an illustration depicting internal configuration of the sine wave generating circuit.

FIG. 25 is an illustration depicting internal configuration of the sine wave generating circuit 700. The sine wave generating circuit 700 includes a PLL circuit 710 and a waveform table 720. The PLL circuit 710 has a phase comparator 712, a loop filter 714, a voltage-controlled oscillator 716, and a frequency divider 718. The frequency divider 718 stores a frequency division value Na. The sensor output SSD is input to the phase comparator 712. Meanwhile, a frequency-divided signal DVSSD generated by the frequency divider 718 is input to the phase comparator 712, as a comparison signal. The phase comparator 712 generates an error signal CPS representing phase difference between these two signals SSD, DVSSD. This error signal CPS is sent to the loop filter 714, which has an internal charge pump circuit. The loop filter 714 then generates and outputs a voltage control signal LPS having voltage level dependent on the pulse level and pulse count of the error signal CPS.

The voltage control signal LPS is supplied to the voltage-controlled oscillator (VCO) 716. The voltage-controlled oscillator 716 outputs a variable clock signal VSSD having frequency dependent on the voltage level of the voltage control signal LPS. The frequency divider 718 divides the frequency of the variable clock signal VSSD by 1/Na, and generates the frequency-divided signal DVSSD. As noted, this frequency-divided signal DVSSD is sent to the phase comparator 712 for phase comparison with the sensor output SSD. As a result, the frequency of the variable clock signal VSSD converges in such a way that the phase difference of the two signals SSD, DVSSD becomes zero. The frequency of the variable clock signal VSSD subsequent to convergence is a value equal to the frequency division value Na multiplied by the frequency of sensor output SSD.

A address of the waveform table 720 changes cyclically in a range of zero to (Na−1) according to pulses of the frequency-divided signal DVSSD. Then, the waveform table 720 sequentially outputs waveform value signals WD stored at individual addresses. The waveform value is set to a value such that a single sine wave is generated during the time that Na pulses occur. In the present embodiment, the range for waveform value is from +127 to −127. On the basis of the waveform value signal WD, the encoder 560 (FIG. 23) generates the multiplication value Ma and the positive/negative signal Pa.

In this way, the excitation interval signal Ea may be generated at will in the same way as in Embodiment 1 through Embodiment 3 using the magnetic sensor 40d that outputs the digital signal in stead of the magnetic sensor 40 that outputs the analog signal.

E. Embodiment 5

Figure 26:
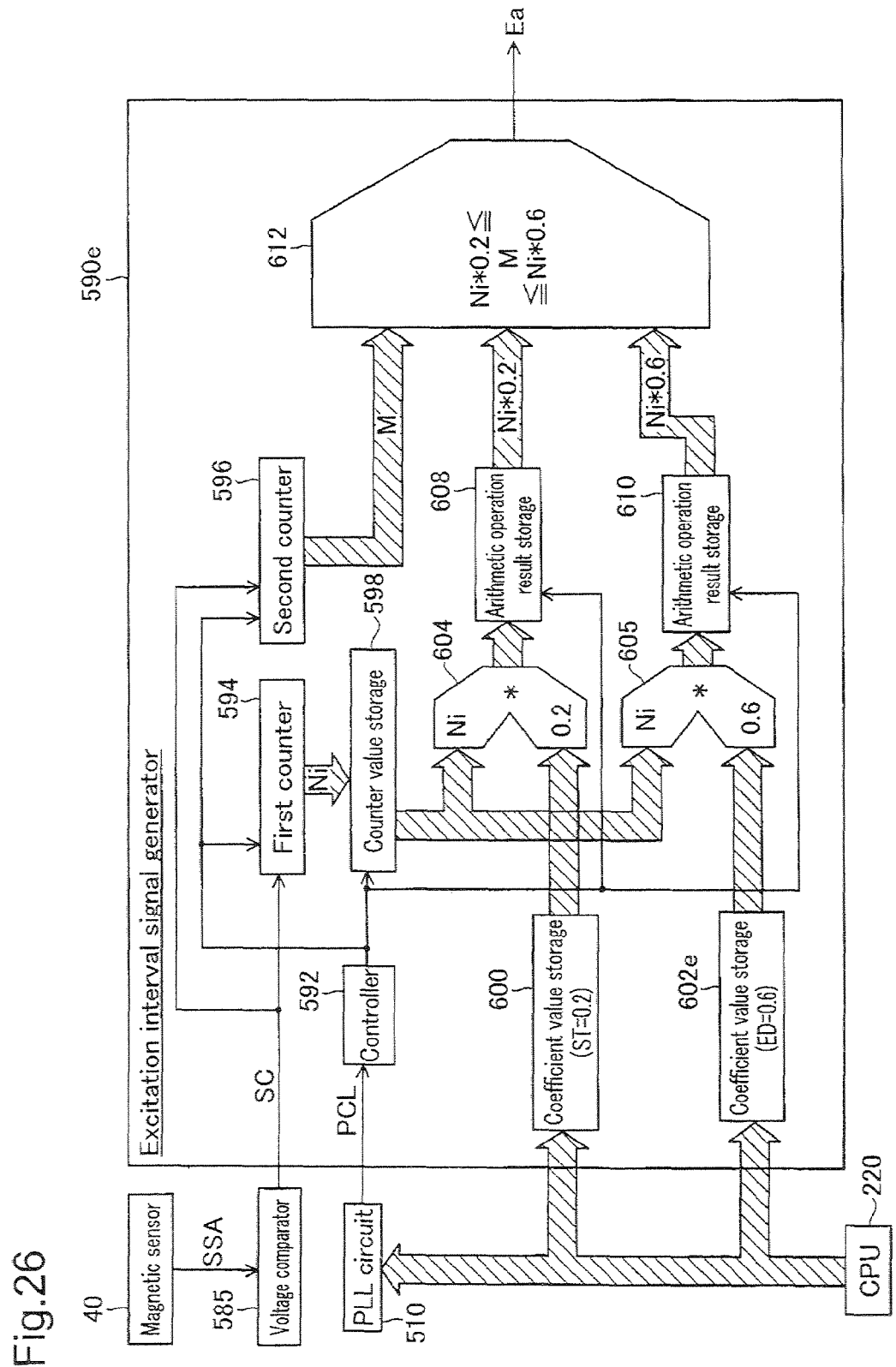
FIG. 26 is an illustration depicting configuration of an excitation interval signal generator in embodiment 5.

FIG. 26 is an illustration depicting the configuration of an excitation interval signal generator 590e in embodiment 5. The only difference from Embodiment 1 shown in FIG. 16 is that the coefficient value ED stored in the coefficient value storage 602e is set as a value independent of the coefficient value ST; the configuration is otherwise identical to Embodiment 1.

Figure 27:
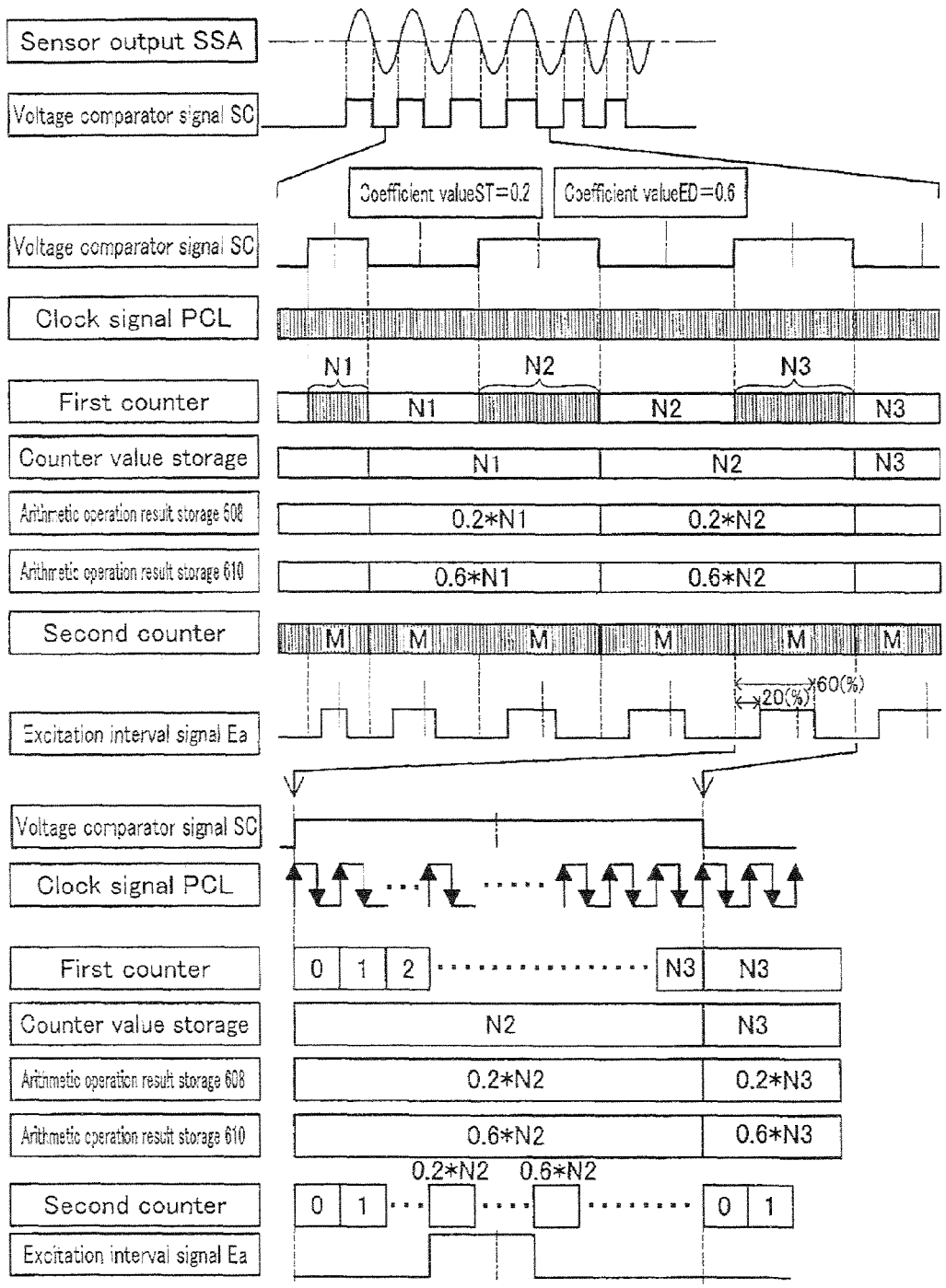
FIG. 27 is a timing chart depicting operation of the excitation interval signal generator in embodiment 5.

FIG. 27 is a timing chart depicting operation of the excitation interval signal generator 590e in Embodiment 5. The only differences from Embodiment 1 shown in FIG. 17 are that the value of the coefficient value ED is set to 0.6 by the CPU 220; and that the center location of the excitation interval EP of the excitation interval signal Ea is a location earlier in time than the center location of the High level signal interval of the voltage comparator signal SC; operation is otherwise the same as in Embodiment 1.

Figure 28:
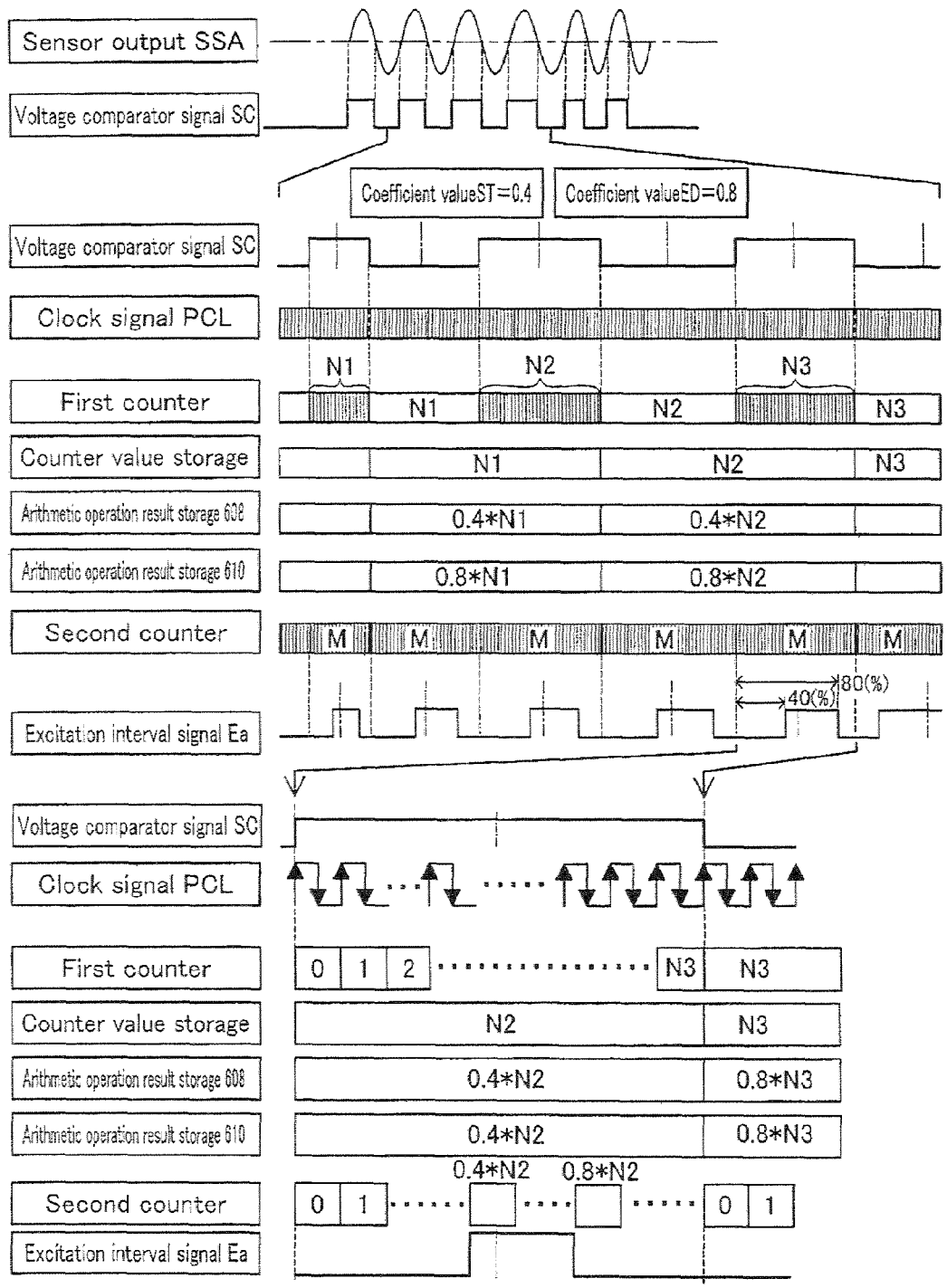
FIG. 28 is a timing chart depicting another example of operation of the excitation interval signal generator in embodiment 5.

FIG. 28 is a timing chart depicting another example of operation of the excitation interval signal generator 590e in Embodiment 5. The only differences from FIG. 27 are that the coefficient value ST is set to 0.4 and the coefficient value ED is set to 0.8; and that the center location of the excitation interval EP of the excitation interval signal Ea is a location later in time than the center location of the High level signal interval of the voltage comparator signal SC; operation is otherwise the same as in FIG. 27.

Where the value of the coefficient value ST and the value of the coefficient value ED is set arbitrarily by the CPU 220 in the above manner, it is possible to set the phase of the excitation interval EP (the temporal duration and temporal location) at will. For example, in the event that a delay in electrical current phase in response to motor speed arises due to the effects of impedance, it is preferable to set the value of the coefficient value ST and the value of the coefficient value ED such that the center location of the excitation interval EP moves to a location forward in time in order to correct this delay. By so doing, angle advance control through advance of phase of the first and second drive signals DRVA1 and 2 may be carried out simply by advancing the temporal location of the excitation interval EP, without the need to advance the phase of the first and second PWM signals PWM1 and 2. Delay angle control may also be carried out, analogously to angle advance control.

Figure 29:
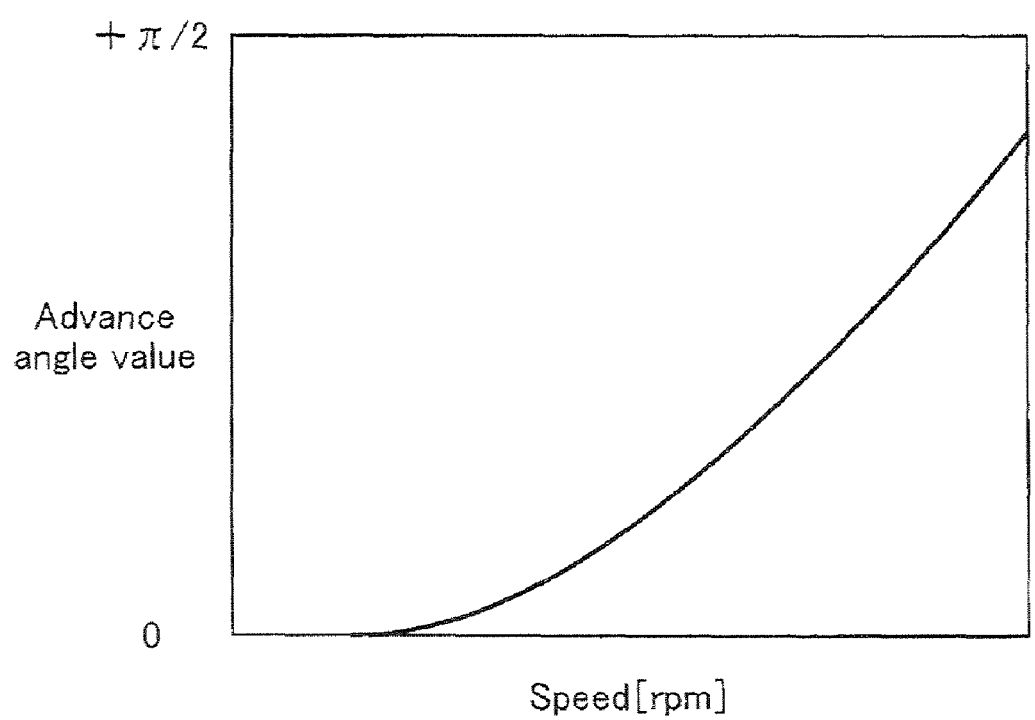
FIG. 29 is a graph depicting the relationship of motor speed and angle of advance where angle advance control is carried out.

FIG. 29 is a graph depicting the relationship of motor speed and angle of advance where angle advance control is carried out. In preferred practice, the CPU 220 may determine the advance angle of the excitation interval EP depending on the speed of the motor, and then set the value of the coefficient value ST and the value of the coefficient value ED so as to achieve this advance angle.

F. Embodiment 6

Figure 30:
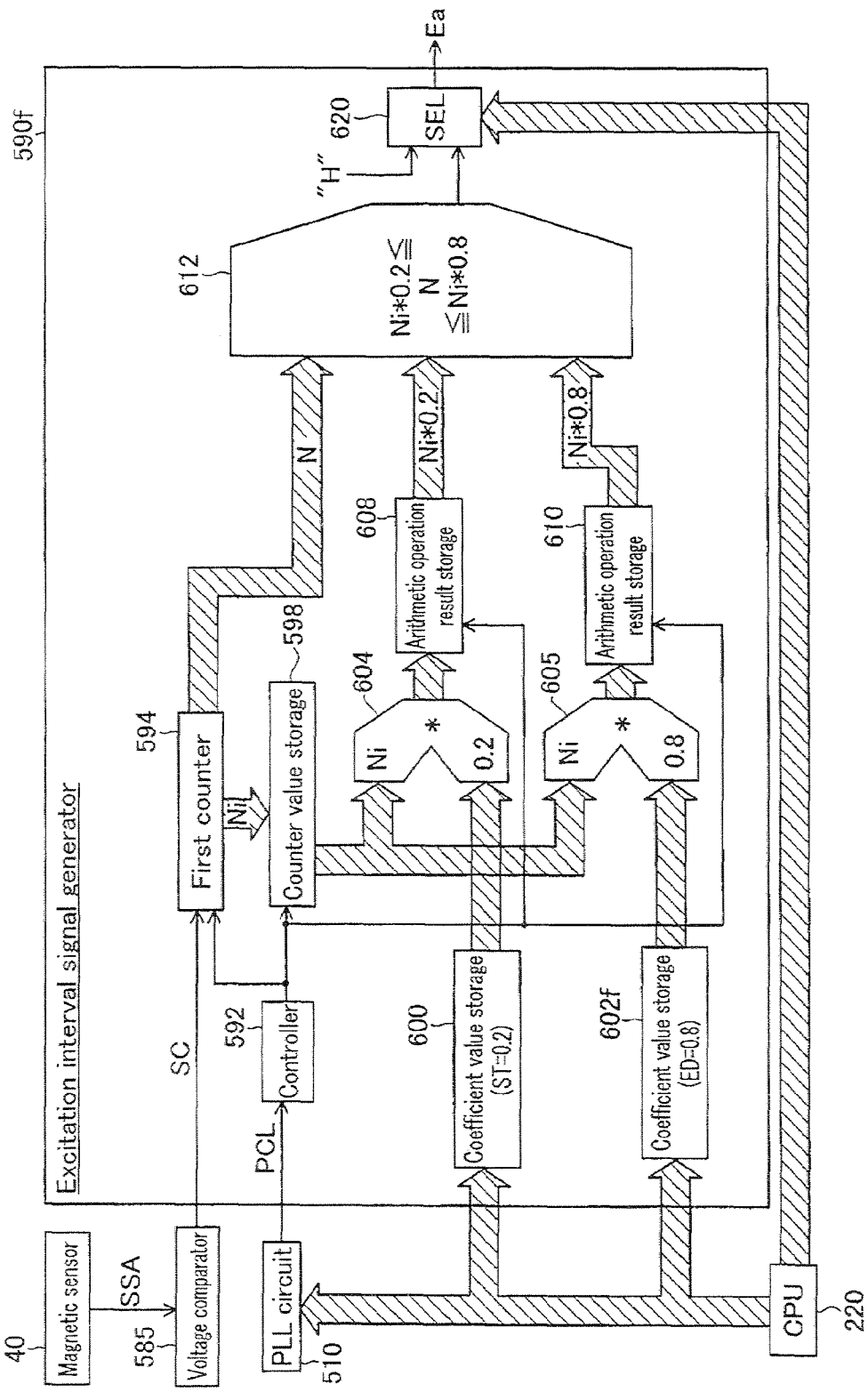
FIG. 30 is an illustration depicting the configuration of an excitation interval signal generator in embodiment 6.

FIG. 30 is an illustration depicting the configuration of an excitation interval signal generator 590f in embodiment 6. The only difference from Embodiment 3 shown in FIG. 21 is that the coefficient value ED stored in the coefficient value storage 602f is set by the CPU 220; in other respects it is identical to Embodiment 3. In Embodiment 6, in the same way as in Embodiment 5, it is possible to adjust the phase of the excitation interval EP at will.

G. Modifications

The present invention is not limited to the embodiments described hereinabove, and may be reduced to practice in various other ways without departing from the spirit thereof. Modifications such as the following may be possible, for example.

G1. Modification 1

In the preceding embodiments, the excitation interval EP for excitation of the coils of the electric motor is settable to any interval through modification of the value of the coefficient value ST and the value of the coefficient value ED; however, the interval may be set to any of multiple intervals including symmetrical intervals centered on the center of each half-cycle of the excitation cycle and unsymmetrical intervals. For example, the value of the coefficient value ST and the value of the coefficient value ED in Embodiments 1 through 6 may be fixed values; or it is possible to employ certain prescribed values on the value of the coefficient value ST and the value of the coefficient value ED.

G2. Modification 2

In the preceding embodiments, the PWM signal generator 535 is used as the original drive signal generator, and the PWM signals PWM1, 2 are used as the original drive signals; however, it is possible to instead use a rectangular signal generator that generates a rectangular signal on the basis of a positional signal which indicates relative position of the first and second drive members of the electric motor, and to use the rectangular signal as the drive signal.

G3. Modification 3

In Embodiment 2, the value of the coefficient value ED is set by the arithmetic circuit 606 (FIG. 19); however, it is possible to instead omit the arithmetic circuit 606 and connect the coefficient value storage 202 with the CPU 220 by a control bus, in order to have the CPU 220 set the value of the coefficient value ED independently of the coefficient value ST in the same manner as in Embodiment 5 (FIG. 26) and Embodiment 6 (FIG. 30). In Embodiment 4, discussion of the internal structure of the excitation interval signal generator 590 (FIG. 23) is omitted; but by employing a configuration similar to that of Embodiments 5 and 6 in Embodiment 4 as well, it is possible to set the value of the coefficient value ED independently of the coefficient value ST.

G4. Modification 4

In Embodiments 1 through 3, the arithmetic circuit 606 (FIG. 16, FIG. 19, FIG. 21) derived the value of the coefficient value ED through subtraction of the coefficient value ST from 1; however, it is possible to instead employ some other computing equations that give the coefficient value ED a value which is greater than the value of the coefficient value ST, and less than 1.0. For example, the following Equation (1) may be employed.

$$ED = ST + 0.2 (0 \leq ST \leq 0.8) \quad (1)$$

According to this Equation (1), the temporal location of the excitation interval EP may be shifted depending on the value of the coefficient value ST, while maintaining the temporal duration of the excitation interval EP at a fixed value (in this case, 0.2). Accordingly, it is also possible to use this Equation (1) in angle advance control according to the rotation speed of the motor as described previously. While in Embodiment 4, discussion of the internal structure of the excitation interval signal generator 590 (FIG. 23) is omitted, in Embodiment 4 as well it is possible to employ another computing equation like that given by Equation (1) in the arithmetic circuit.

G5. Modification Example 5

In the preceding embodiments, a single-phase brushless motor is furnished with the excitation interval signal generator 590; however, instead, a brushless motor with two phases or three or more phases may be furnished with the excitation interval signal generator 590. In this case, where the results of the arithmetic operation result storages 608, 610 (FIG. 16) obtained in any one phase are used in the comparator 612 in another phase, it may be possible to dispense with the multiplier circuits 604, 605 etc. in this other phase.

G6. Modification 6

In the preceding embodiments, a motor of rotary type is furnished with the excitation interval signal generator 590;

however, instead, a linear motor may be furnished with the excitation interval signal generator 590.

G7. Modification 7

The excitation interval signal generator 590 may be configured as a circuit in which High level and Low level are reversed from the preceding embodiments.

G8. Modification 8

The present invention is applicable to various kinds of devices. For example, the present invention is implemented in a motor in any of various devices such as fan motors, clocks (for driving the hands), drum type washing machines (single rotation), jet coasters, vibrating motors, and the like. Where the present invention is implemented in a fan motor, the various advantages mentioned previously (low power consumption, low vibration, low noise, minimal rotation irregularity, low heat emission, and long life) is particularly notable. Such fan motors can be employed, for example, as fan motors for various devices such as digital display devices, vehicle on-board devices, fuel cell type PCs, fuel cell type digital cameras, fuel cell type video cameras, fuel cell type mobile phones, various other fuel cell-powered devices, and projectors. The motor of the present invention may also be utilized as a motor for various types of household electric appliances and electronic devices. For example, a motor in accordance with the present invention may be employed as a spindle motor in an optical storage device, magnetic storage device, polygon mirror drive, or the like. The motor of the present invention may also be utilized as a motor for a movable body or a robot.

Figure 31:
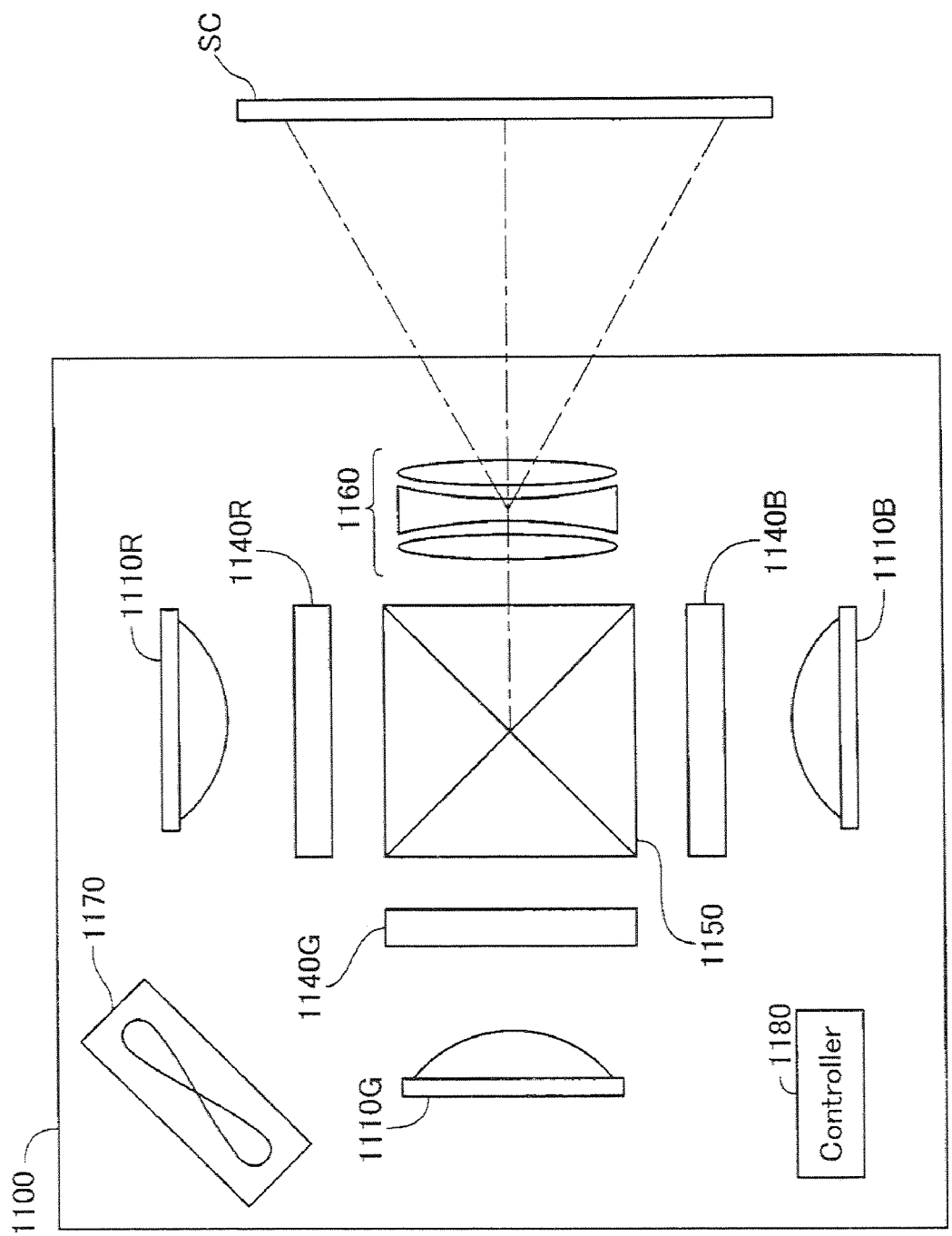
FIG. 31 is an illustration depicting a projector which utilizes a motor according to the present invention.

FIG. 31 is an illustration depicting a projector which utilizes a motor according to the present invention. This projector 1100 has three light sources 1110R, 1110G, 1110B for emitting light of the three colors red, green, and blue; liquid crystal light valves 1140R, 1140G, 1140B for modulating light of the three colors; a cross dichroic prism 1150 for synthesizing modulated light of the three colors; a projection lens system 1160 for projecting light synthesized from the three colors onto a screen SC; a cooling fan 1170 for cooling the interior of the projector; and a controller 1180 for controlling the entire projector 1100. Any of the various brushless motors described above may be used as the motor for driving the cooling fan 1170.

Figure 32A:
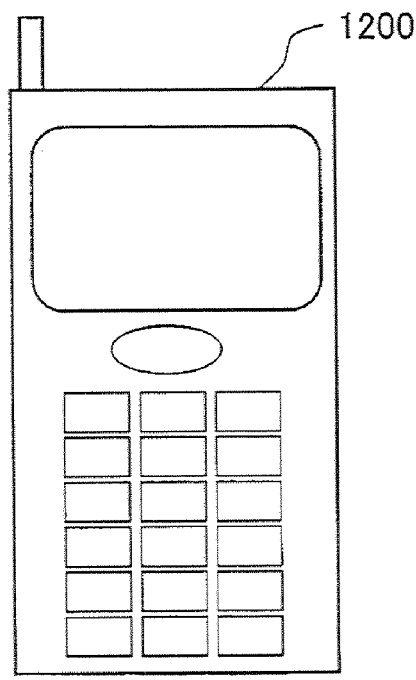
FIGS. 32A to 32C are illustrations depicting fuel cell type mobile phone which utilizes a motor according to the present invention.
Figure 32B:
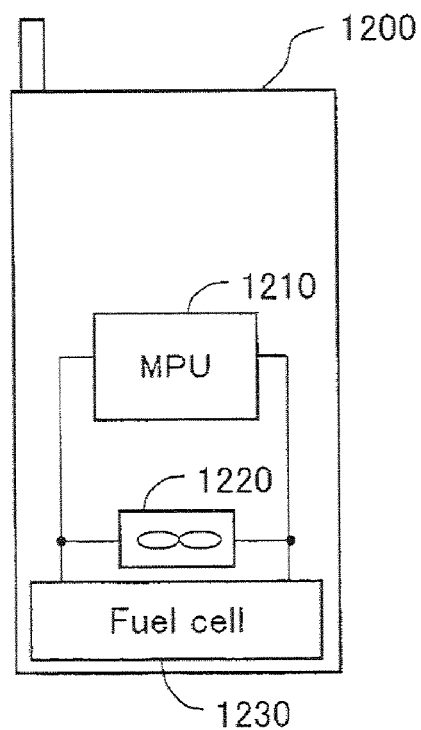
Figure 32C:
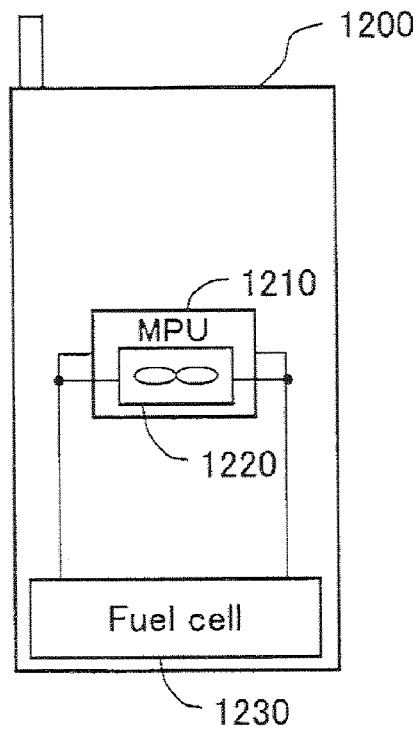

FIGS. 32A to 32C illustrate a fuel cell type mobile phone which utilizes a motor according to the present invention. FIG. 32A shows an exterior view of a mobile phone 1200, and FIG. 32B shows an example of internal configuration. The mobile phone 1200 includes an MPU 1210 for controlling operation of the mobile phone 1200; a fan 1220; and a fuel cell 1230. The fuel cell 1230 supplies power to the MPU 1210 and to the fan 1220. The fan 1220 blows air into the mobile phone 1200 from the outside in order to supply air to the fuel cell 1230, or in order to expel moisture evolved in the fuel cell 1230 from the inside of the mobile phone 1200 to the outside. The fan 1220 may also be positioned on the MPU 1210 as shown in FIG. 32C, to cool the MPU 1210. Any of the various brushless motors described above can be used as the motor for driving the fan 1220.

Figure 33:
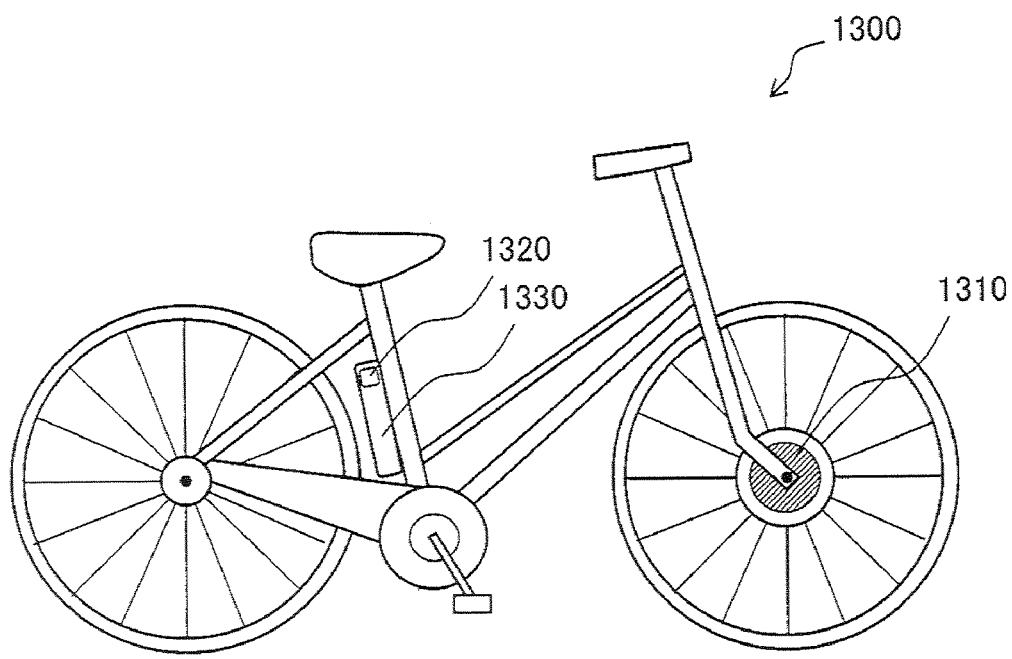
FIG. 33 is an illustration depicting an electrically powered bicycle (power assisted bicycle) as an example of a moving body utilizing a motor/generator according to an embodiment of the present invention.

FIG. 33 is an illustration depicting an electrically powered bicycle (power assisted bicycle) as one example of a movable body that utilizes a motor/generator according to the embodiments of the present invention. This bicycle 1300 is provided with a motor 1310 on its front wheel; and with a control circuit 1320 and a rechargeable battery 1330 disposed on the frame below the saddle. The motor 1310 uses power from the rechargeable battery 1330 to drive the front wheel, thereby assisting travel. During braking, regenerative power from the motor 1310 is used to charge the rechargeable battery 1330. The control circuit 1320 is a circuit for controlling driving and regeneration of the motor. Any of the various brushless motors described above can be used as the motor 1310.

Figure 34:
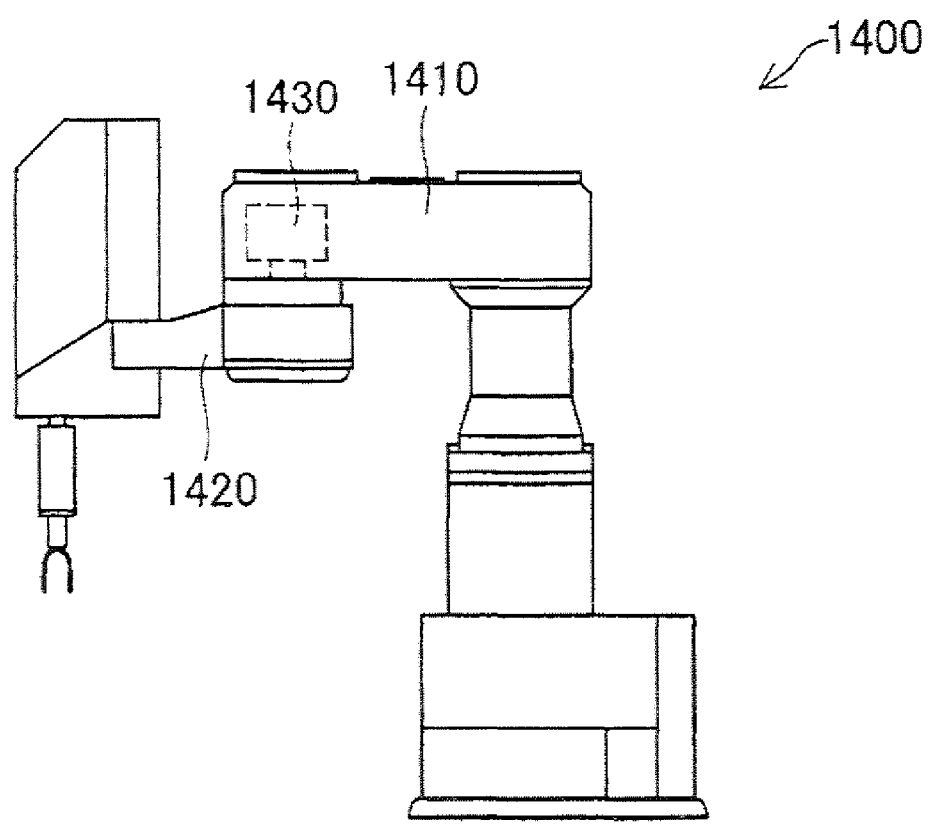
FIG. 34 is an illustration depicting an example of a robot which utilizes a motor according to an embodiment of the present invention.

FIG. 34 is an illustration showing an example of a robot which utilizes a motor according to the embodiments of the present invention. This robot 1400 has first and second arms 1410, 1420, and a motor 1430. This motor 1430 is used during horizontal rotation of the second arm 1420 as the driven member. Any of the various brushless motors described above can be used as the motor 1430.

H. Other Embodiments

Figure 35:
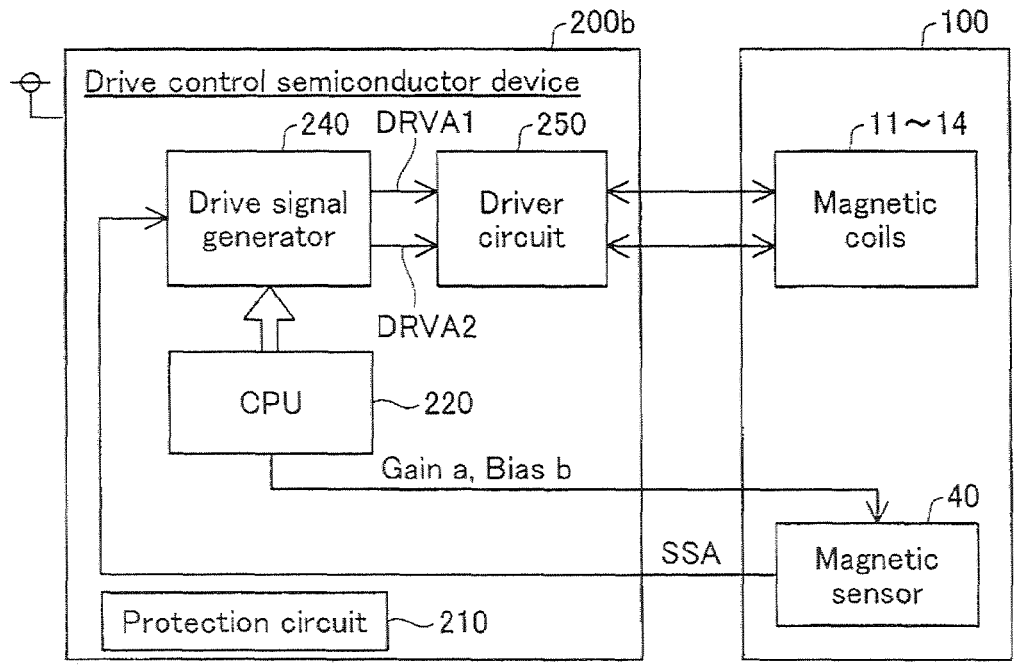
FIG. 35 is a block diagram showing the configuration of a drive control semiconductor device and the motor unit of the blushless motor in another embodiment.

FIG. 35 is a block diagram showing the configuration of a drive control semiconductor device 200b and the motor unit 100 of the blushless motor in another embodiment. The drive control semiconductor device 200b has a drive signal generator 240, a driver circuit 250, a CPU 220, and a protection circuit 210. The drive signal generator 240, the driver circuit 250, and the CPU 220 are the same as those shown in FIG. 7A. The protection circuit 210 is a circuit for protecting the motor that utilizes the drive control semiconductor device 200b by detecting troubles of the motor. Examples of the protection circuit 210 include an overheat protection circuit, an overvoltage protection circuit, and an overcurrent protection circuit for power ICs; and a low-voltage protection circuit for control ICs. As described above, the semiconductor device for driving the blushless motor may include the drive signal generator 240, the driver circuit 250, the CPU 220, and the protection circuit 210 like the drive control semiconductor device 200b shown in FIG. 35. However, the protection circuit 210 may be omitted.

Figure 36:
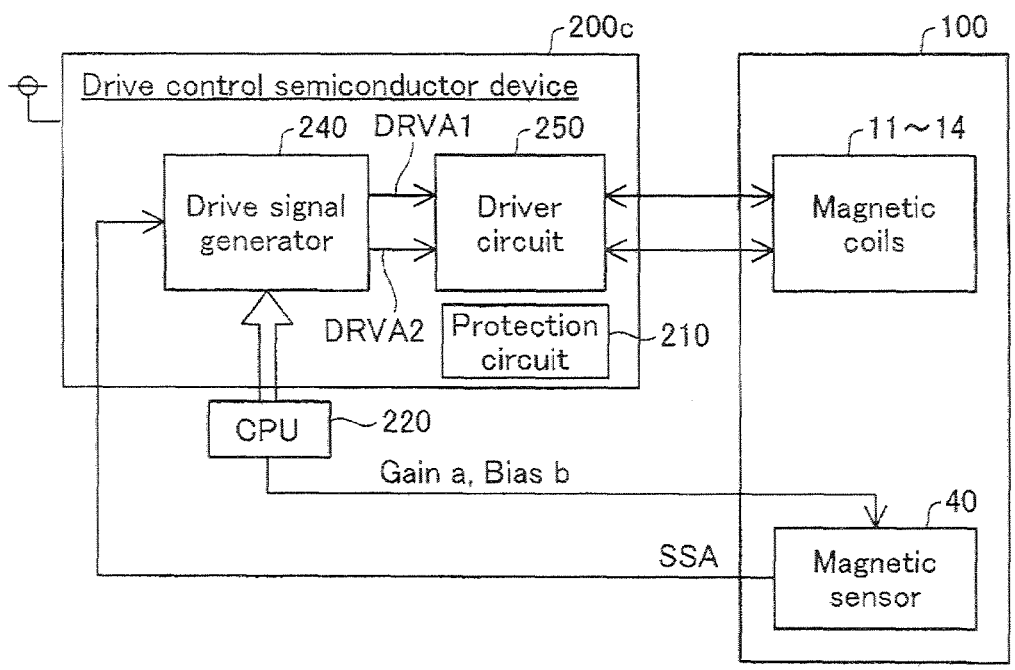
FIG. 36 is a block diagram showing the configuration of a drive control semiconductor device and the motor unit of the blushless motor in still another embodiment.

FIG. 36 is a block diagram showing the configuration of a drive control semiconductor device 200c and the motor unit 100 of the blushless motor in still another embodiment. The difference between the drive control semiconductor device 200c and the drive control semiconductor device 200b shown in FIG. 35 is that the CPU 220 is not included in the drive control semiconductor device 200c. As described above, the semiconductor device for driving the blushless motor need not include the CPU 220 like the drive control semiconductor device 200c shown in FIG. 36. In addition, the protection circuit 210 may be omitted.

Figure 37:
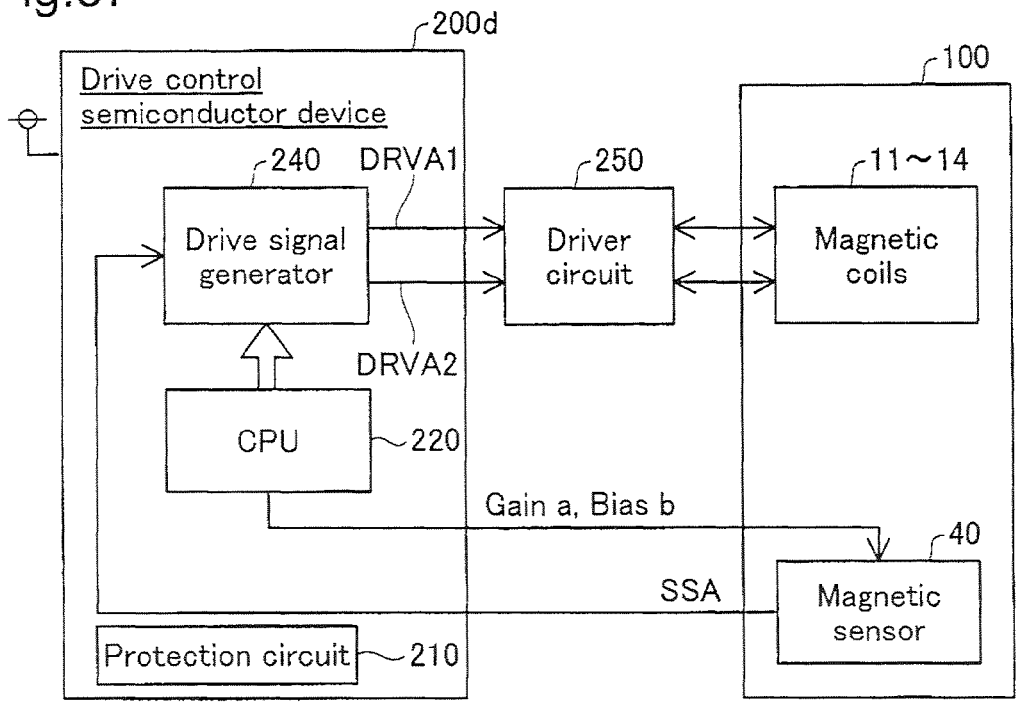
FIG. 37 is a block diagram showing the configuration of a drive control semiconductor device and the motor unit of the blushless motor in another embodiment.

FIG. 37 is a block diagram showing the configuration of a drive control semiconductor device 200d and the motor unit 100 of the blushless motor in another embodiment. The difference between the drive control semiconductor device 200d and the drive control semiconductor device 200b shown in FIG. 35 is that the driver circuit 250 is not included in the drive control semiconductor device 200d. As described above, the semiconductor device for driving the blushless motor need not include the driver circuit 250 like the drive control semiconductor device 200d shown in FIG. 37. In this case, it is preferable that the protection circuit 210 is constructed of a protection circuit for protecting a control circuit like a low-voltage protection circuit. However, the protection circuit 210 may be omitted.

Figure 38:
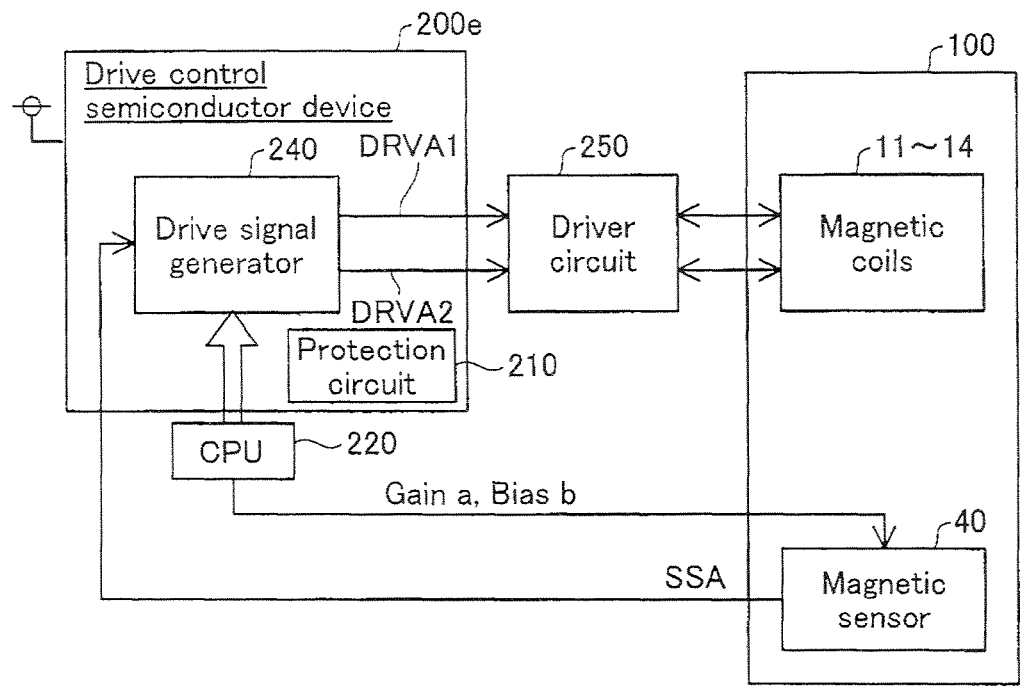
FIG. 38 is a block diagram showing the configuration of a drive control semiconductor device and the motor unit of the blushless motor in another embodiment.
Figure 39:
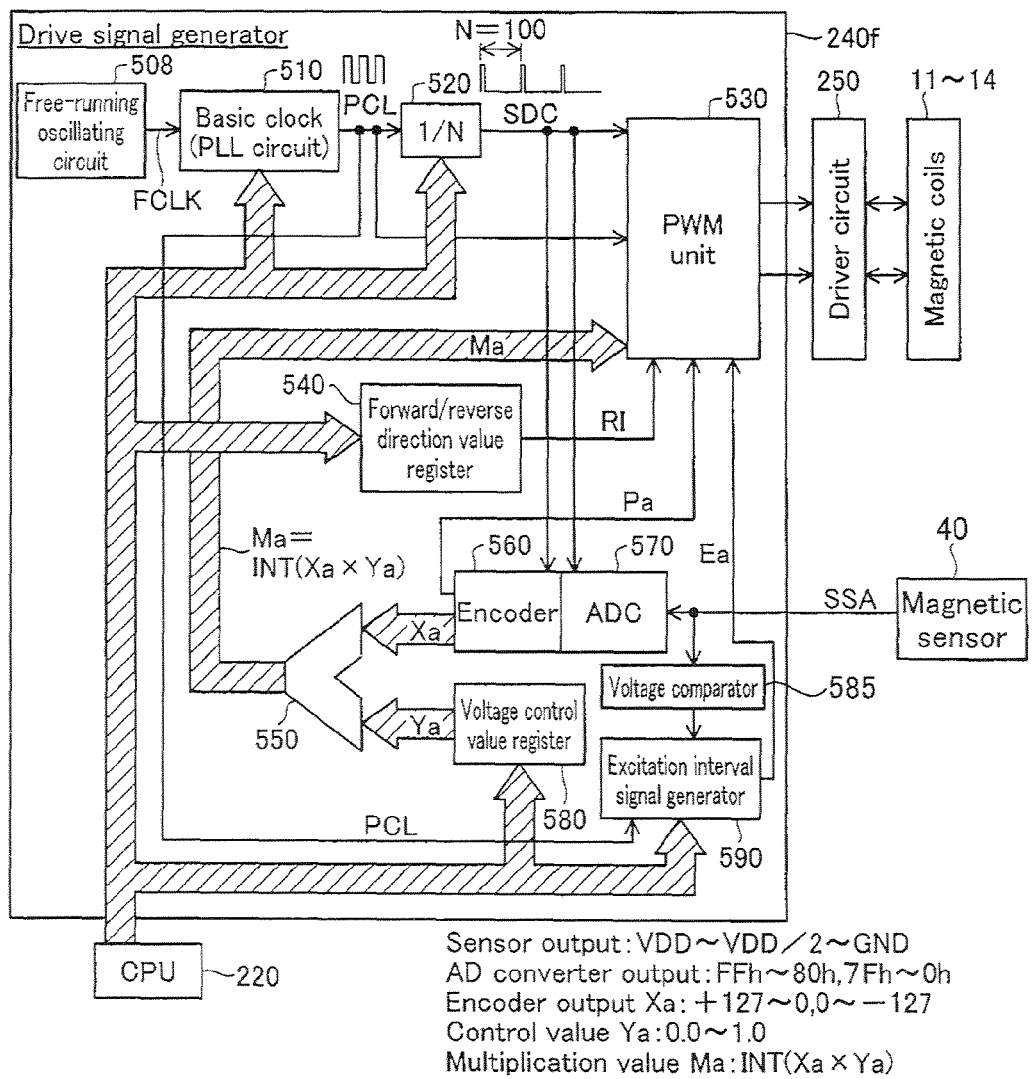
FIGS. 39A to 39E are illustrations depicting internal configuration and operation of the drive signal generator in another embodiment.

FIG. 38 is a block diagram showing the configuration of a drive control semiconductor device 200e and the motor unit 100 of the blushless motor in another embodiment. The difference between the drive control semiconductor device 200e and the drive control semiconductor device 200b shown in FIG. 35 is that the CPU 220 and the driver circuit 250 are not included in the drive control semiconductor device 200e. As described above, the semiconductor device for driving the blushless motor need not include the CPU 220 and the driver circuit 250 like the drive control semiconductor device 200e shown in FIG. 38. That is to say, other integrated circuits may include the driver circuit 250. In this case, it is possible to utilize all-purpose driver integrated circuits instead of the driver circuit 250. Also, it is preferable that the protection circuit 210 is constructed of a protection circuit for protecting a control circuit like a low-voltage protection circuit. However, the protection circuit 210 may be omitted.

FIGS. 39A to 39E are illustrations depicting internal configuration and operation of the drive signal generator 240f in another embodiment. The difference between the drive signal generator 240f and the drive signal generator 240 shown in FIG. 11A is that the drive signal generator 240f is provided with a free-running oscillating circuit 508 in front of the basic clock generating circuit 510 (PLL circuit). The free-running oscillating circuit 508 generates a original clock signal FCLK provided to the basic clock generating circuit 510. The basic clock generating circuit 510 generates the clock signal PCL on the basis of the original clock signal FCLK. It is possible to utilize various kinds of oscillating circuits like a ring oscillator as the free-running oscillating circuit 508. As described above, it is possible to utilize the drive signal generator 240f (FIG. 39A) instead of the drive signal generator 240 (FIG. 11A). That is to say, the semiconductor device for driving the blushless motor may include the free-running oscillating circuit 508.

Figure 40:
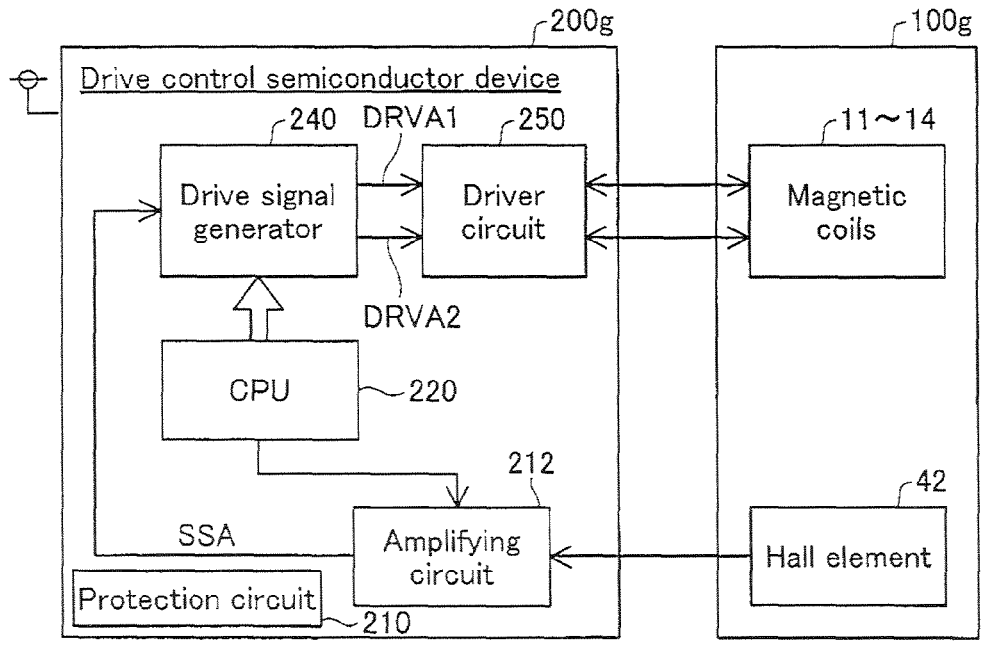
FIG. 40 is a block diagram showing the configuration of a drive control semiconductor device and the motor unit of the blushless motor in another embodiment.

FIG. 40 is a block diagram showing the configuration of a drive control semiconductor device 200g and the motor unit 100g of the blushless motor in another embodiment. The difference between the drive control semiconductor device 200g and the drive control semiconductor device 200b shown in FIG. 35 is that the drive control semiconductor device 200g is provided with a amplifying circuit 212. In this case, a hall element 42 is provided in the drive control semiconductor device 200g. A output signal of the hall element 42 is amplified by the amplifying circuit 212 in the drive control semiconductor device 200g to become the sensor output SSA. As described above, the semiconductor device for driving the blushless motor can include the amplifying circuit 212 like the drive control semiconductor device 200g shown in FIG. 40.

Figure 41:
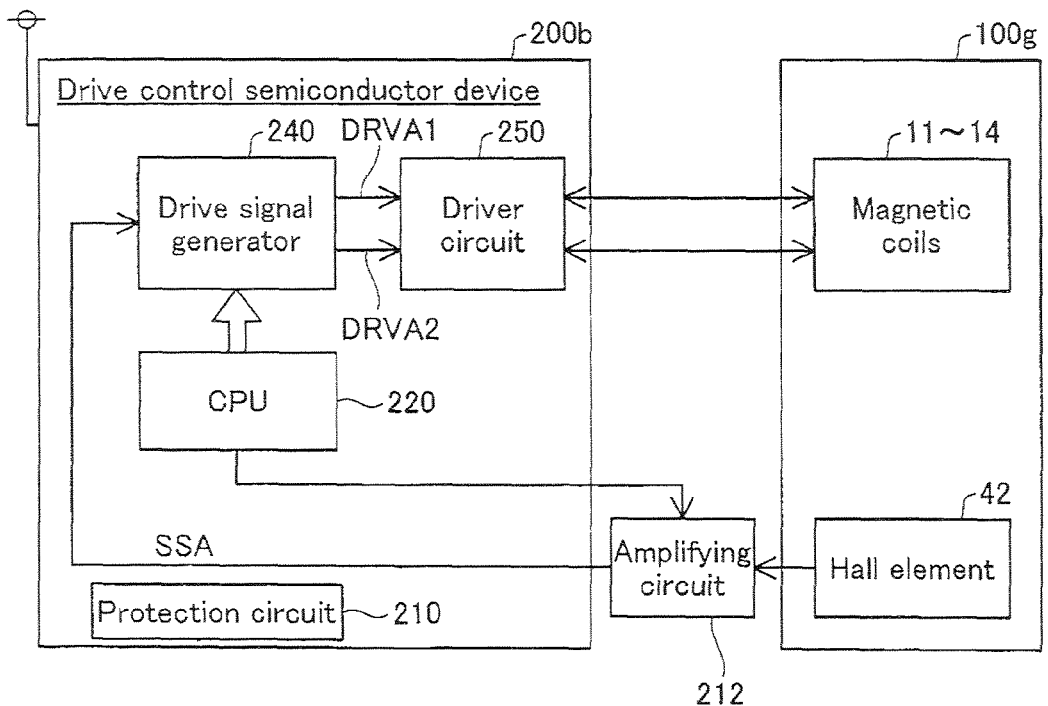
FIG. 41 is a block diagram showing the configuration of a drive control semiconductor device and the motor unit of the blushless motor in another embodiment.

FIG. 41 is a block diagram showing the configuration of a drive control semiconductor device 200b and the motor unit 100g of the blushless motor in another embodiment. In FIG. 41, the amplifying circuit 212 is provided outside of the drive control semiconductor device 200b. As described above, shown in FIG. 41, the semiconductor device for driving the blushless motor needs not include the amplifying circuit 212.

As well, the configurations of the semiconductor devices of embodiments described above are some examples of configurations. It is possible to employ various other configurations of the semiconductor devices.

For example, the semiconductor devices may include at least one of the drive signal generator 240d shown in FIG. 23, the driver circuit 250, and the CPU 220. In this case, it is possible to utilize the magnetic sensor 40d which outputs a digital signal as a position sensor.

Figure 42:
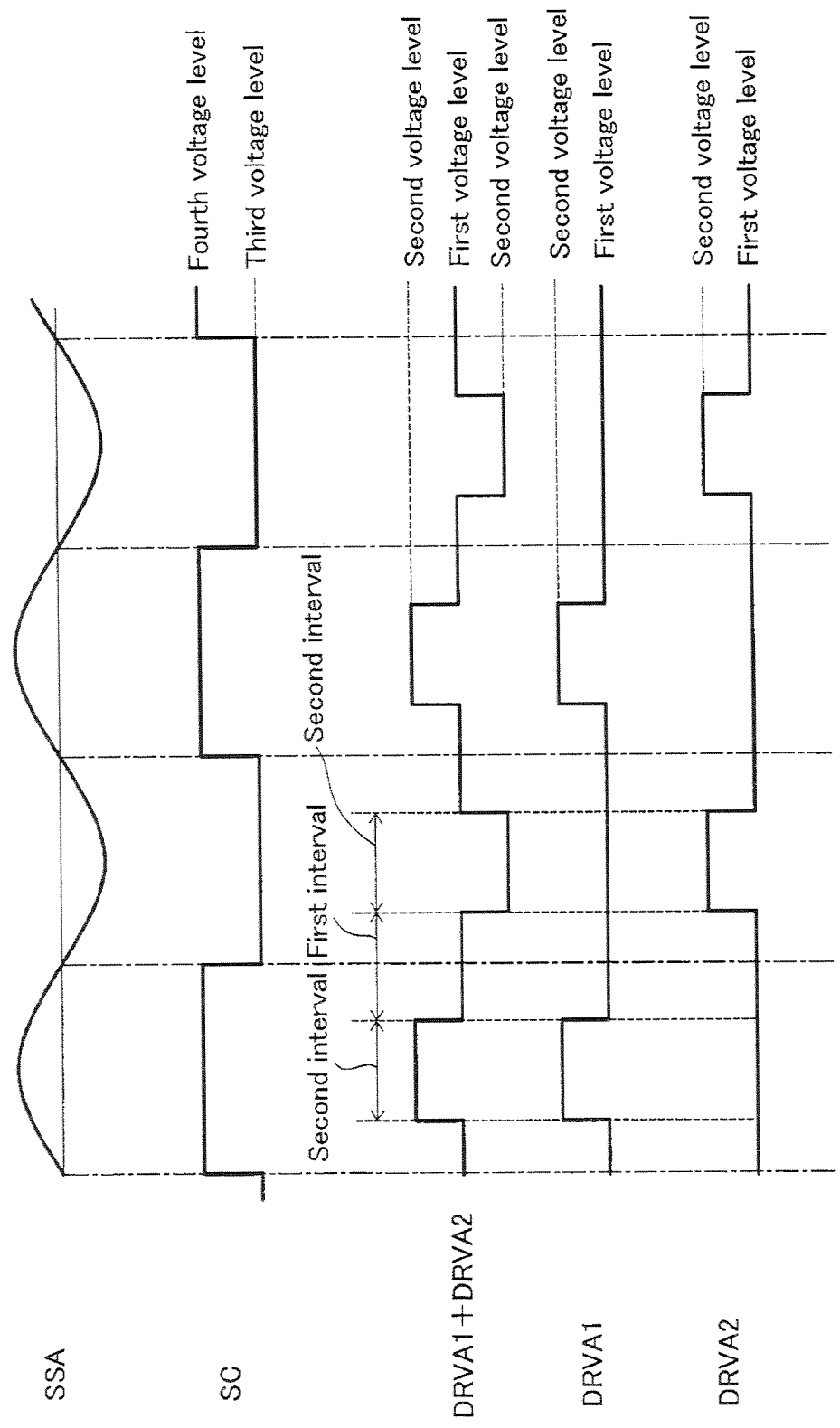
FIG. 42 is a timing chart depicting wave forms of various signals without PWM control.

FIG. 42 is a timing chart depicting wave forms of various signals without PWM control. FIG. 42 depicts the sensor output SSA, the voltage comparator signal SC, and non-PWM drive signals DRVA1, 2. In addition, a signal obtained by combining the first drive signal DRVA1 and the second drive signal DRVA2 are depicted, where the second drive signal DRVA2 is depicted as the negative pulses.

The voltage comparator signal SC is a binary digital signal which indicates a third voltage level and fourth voltage level alternately. The voltage comparator signal SC is synchronized with the sensor output SSA. The drive signals DRVA1, 2 have a first voltage level in the first interval, and have a second voltage level which differs from the first voltage level in the second interval except for the first interval. The first interval corresponds to the non-excitation interval NEP. The second interval corresponds to the excitation interval EP. The first interval and the second interval are set by the excitation interval signal generator 590 (FIG. 16). In the case of the operation of the motor without PWM control, multiplication value Ma is set to the maximum value (=frequency division value N).

FIG. 43 is a timing chart depicting wave forms of various signals with PWM control. FIG. 43 depicts the sensor output SSA, the voltage comparator signal SC, and the PWM drive signals DRVA1, 2. In addition, a signal obtained by combining the first drive signal DRVA1 and the second drive signal DRVA2 are depicted, where the second drive signal DRVA2 is depicted as the negative pulses.

The PWM drive signals DRVA1, 2 have a first voltage level in the first interval, and have the second voltage level and the first voltage level alternately in the second interval except for the first interval.

The sensor output SSA is corresponds to the positional signal in the present invention. The Voltage comparator signal SC is corresponds to the timing signal in the present invention. The drive signals DRVA1, 2 are corresponds to the drive signal in the present invention.

What is claimed is:

1. A semiconductor device, comprising:
   a drive control circuit that generates a drive signal for driving an electric motor having a permanent magnet and a coil, wherein
   the drive control circuit generates the drive signal based on a positional signal which indicates relative position of a first drive member and a second drive member of the electric motor,
   a signal level of the drive signal becomes a first voltage level in a first interval,
   a signal level of the drive signal becomes a second voltage level which is different from the first voltage level in a second interval, and
   the coil of the electric motor is not provided with a current in the first interval,
   wherein a length of the second interval is shorter than a length of interval between a point at which a signal level of a timing signal based on the positional signal becomes a fourth level from a third level and a point at which the signal level of the timing signal becomes the third level.

2. A semiconductor device, comprising:
   a drive control circuit that generates a drive signal for driving an electric motor having a permanent magnet and a coil, wherein
   the drive control circuit generates the drive signal based on a positional signal which indicates relative position of a first drive member and a second drive member of the electric motor,
   a signal level of the drive signal becomes a first voltage level in a first interval,
   a signal level of the drive signal becomes alternately the first voltage level and a second voltage level which is different from the first voltage level in a second interval, and
   the coil of the electric motor is not provided with a current in the first interval, wherein a length of the second interval is shorter than a length of interval between a point at which a signal level of a timing signal based on the positional signal becomes a fourth level from a third level and a point at which the signal level of the timing signal becomes the third level.

3. A semiconductor device for driving an electric motor, comprising:
an original drive signal generator that generates an original drive signal;
an excitation interval setter that is able, for each half cycle of respective length π in each 2π excitation cycle of the original drive signal, to set an excitation interval to excite coils of the electric motor to either one of a symmetrical interval centered on a center of each half-cycle and an unsymmetrical interval;
a drive signal shaping circuit that generates a drive signal for driving the electric motor, by validating the original drive signal during the excitation intervals and invalidating the original drive signal during non-excitation intervals other than the excitation interval; and
a clock signal generator that generates a clock signal;
wherein the excitation interval setter sets the excitation interval utilizing the clock signal.

4. The semiconductor device according to claim 3, further comprising:
an analog-digital converter that converts the positional signal to digital values;
wherein the original drive signal generator generates the original drive signal based on the digital positional signal values.

5. The semiconductor device according to claim 4, further comprising:
an amplifier that amplifies the positional signal;
wherein the analog-digital converter converts the amplified positional signal to digital values.

6. A drive control circuit for an electric motor, comprising:
an original drive signal generator that generates an original drive signal;
an excitation interval setter that is able, for each half cycle of respective length π in each 2π excitation cycle of the original drive signal, to set an excitation interval to excite coils of the electric motor to either one of a symmetrical interval centered on a center of each half-cycle and an unsymmetrical interval; and
a drive signal shaping circuit that generates a drive signal for driving the electric motor, by validating the original drive signal during the excitation intervals and invalidating the original drive signal during non-excitation intervals other than the excitation interval;
wherein
the original drive signal generator generates the original drive signal based on a positional signal which indicates relative position of a first drive member and a second drive member of the electric motor; and
the excitation interval setter includes:
an interval measurer that measures a first level interval representing a length of time for which a periodic timing signal synchronized with the positional signal shows a first level;
a start time setter that multiplies the first level interval by a first coefficient value which is a positive value less than 1, to derive a first interval;
an end time setter that multiplies the first level interval by a second coefficient value which is a value greater than the first coefficient value and less than 1, to derive a second interval; and
an excitation interval controller that controls the excitation interval by comparing the first interval with a first level-elapsed interval which represents elapsed time after the timing signal shows a transition from a second level to the first level, and starting the excitation interval at a timing at which the first level-elapsed interval becomes equal to the first interval; and comparing the second interval with the first level-elapsed interval, and starting the non-excitation interval at a timing at which the first level-elapsed interval becomes equal to the second interval.

7. The drive control circuit according to claim 6, wherein the excitation interval setter sets the excitation interval to the unsymmetrical interval.

8. The drive control circuit according to claim 6, wherein the excitation interval controller further
controls the excitation interval by comparing the first interval with a second level-elapsed interval which represents elapsed time after the timing signal shows a transition from the first level to the second level, and starting the excitation interval at a timing at which the second level-elapsed interval becomes equal to the first interval; and comparing the second interval with the second level-elapsed interval, and starting the non-excitation interval at a timing at which the second level-elapsed interval becomes equal to the second interval.

9. The drive control circuit according to claim 6, wherein the excitation interval controller performs the comparison using the first interval and the second interval that have been derived based on the first level interval of the timing signal immediately prior to performing the comparison.

10. The drive control circuit according to claim 6, wherein a sum of the first coefficient value and the second coefficient value is 1.

11. The drive control circuit according to claim 6 wherein the original drive signal generator includes a PWM signal generator that generates a PWM signal based on the positional signal, as the original drive signal.

12. An electric motor, comprising the drive control circuit according to claim 6.

13. A device, comprising:
the electric motor according to claim 12; and
a driven member which is driven by the electric motor.

14. A device according to claim 13, wherein the device is a projector.

15. A device according to claim 13, wherein the device is a mobile device.

16. A device according to claim 13, wherein the device is a robot.

17. A device according to claim 13, wherein the device is a movable body.

18. A drive control circuit for an electric motor, comprising:
an original drive signal generator that generates an original drive signal;
an excitation interval setter that is able, for each half cycle of respective length π in each 2π excitation cycle of the original drive signal, to set an excitation interval to excite coils of the electric motor to either one of a symmetrical interval centered on a center of each half-cycle and an unsymmetrical interval; and
a drive signal shaping circuit that generates a drive signal for driving the electric motor, by validating the original drive signal during the excitation intervals and invalidating the original drive signal during non-excitation intervals other than the excitation interval;
wherein the original drive signal generator generates the original drive signal based on a positional signal which indicates relative position of a first drive member and a second drive member of the electric motor; and the excitation interval setter includes:
- an interval measurer that measures a first level interval representing a length of time for which a periodic timing signal synchronized with the positional signal shows a first level, and a second level interval representing a length of time for which the timing signal shows a second level;
- a start time setter that derives a first interval equal to the first level interval multiplied by a first coefficient value which is a positive value less than 1, and a third interval equal to the second level interval multiplied by the first coefficient value;
- an end time setter that derives a second interval equal to the first level interval multiplied by a second coefficient value which is a value greater than the first coefficient value and less than 1, and a fourth interval equal to the second level interval multiplied by the second coefficient value; and
- an excitation interval controller that controls the excitation interval by
- comparing the first interval with a first level-elapsed interval which represents elapsed time after the timing signal shows a transition from the second level to the first level, and starting the excitation interval at a timing at which the first level-elapsed interval becomes equal to the first interval;
- comparing the second interval with the first level-elapsed interval, and starting the non-excitation interval at a timing at which the first level-elapsed interval becomes equal to the second interval;
- comparing the third interval with a second level-elapsed interval which represents elapsed time after the timing signal shows a transition from the first level to the second level, and starting the excitation interval at a timing at which the second level-elapsed interval becomes equal to the third interval; and
- comparing the fourth interval with the second level-elapsed interval, and starting the non-excitation interval at a timing at which the second level-elapsed interval becomes equal to the fourth interval.

19. The drive control circuit according to claim 18, wherein the excitation interval controller performs the comparison using the first through fourth intervals that have been derived based on the at least one of the first level interval and the second level interval of the timing signal immediately prior to performing the comparison.

* * * * *